(12) United States Patent
Shindo et al.

(10) Patent No.: US 12,456,605 B2
(45) Date of Patent: Oct. 28, 2025

(54) PLASMA PROCESSING APPARATUS AND PLASMA PROCESSING METHOD

(71) Applicant: TOKYO ELECTRON LIMITED, Tokyo (JP)

(72) Inventors: Takahiro Shindo, Yamanashi (JP); Seiichi Okamoto, Yamanashi (JP); Hiroshi Otomo, Yamanashi (JP); Takamichi Kikuchi, Yamanashi (JP); Tatsuo Matsudo, Yamanashi (JP); Yasushi Morita, Yamanashi (JP); Takashi Sakuma, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 657 days.

(21) Appl. No.: 17/374,671

(22) Filed: Jul. 13, 2021

(65) Prior Publication Data

US 2022/0020568 A1    Jan. 20, 2022

(30) Foreign Application Priority Data

Jul. 14, 2020   (JP) .................................. 2020-120879
Jan. 20, 2021   (JP) .................................. 2021-007232

(51) Int. Cl.
*H01J 37/32*       (2006.01)
*H01L 21/311*      (2006.01)
*H01L 21/3205*     (2006.01)

(52) U.S. Cl.
CPC .. *H01J 37/32174* (2013.01); *H01J 37/32146* (2013.01); *H01J 37/3244* (2013.01);
(Continued)

(58) Field of Classification Search
CPC .......... H01J 37/32174; H01J 37/32146; H01J 37/32128; H01J 37/32091; H01J 37/32155
(Continued)

(56) References Cited

U.S. PATENT DOCUMENTS 5,025,135 A * 6/1991 Gesche ................ H05H 1/0081
                                              204/298.38
7,506,610 B2 * 3/2009 Koshiishi .......... H01J 37/32577
                                              156/345.47
(Continued)

FOREIGN PATENT DOCUMENTS

JP     2000-306891 A    11/2000
JP     4198669 B2       12/2008
KR     10-0886273 B1     3/2009

*Primary Examiner* — Aiden Lee
(74) *Attorney, Agent, or Firm* — Fenwick & West LLP

(57) ABSTRACT

A plasma processing apparatus is provided to perform plasma processing on a substrate. The plasma processing apparatus includes a processing chamber, a substrate support disposed in the processing chamber to place thereon the substrate, a grounded lower electrode provided in the substrate support, an upper electrode disposed to face the lower electrode, a gas supply unit to supply a processing gas to a space between the upper electrode and the substrate support, and a radio frequency power supply to apply RF power to the upper electrode to generate plasma of the processing gas. The plasma processing apparatus further includes a voltage waveform shaping unit provided between the RF power supply and the upper electrode to shape a voltage waveform of the RF power supply to suppress a positive voltage of the RF voltage applied to the upper electrode.

16 Claims, 26 Drawing Sheets

(52) U.S. Cl.
CPC .. *H01J 37/32568* (2013.01); *H01L 21/31138* (2013.01); *H01L 21/32051* (2013.01); *H01J 2237/332* (2013.01); *H01J 2237/334* (2013.01)

(58) Field of Classification Search
USPC .......................................................... 156/345
See application file for complete search history.

(56) References Cited

U.S. PATENT DOCUMENTS

| | | | | |
|---|---|---|---|---|
| 7,513,954 | B2* | 4/2009 | Iizuka | H01J 37/321 |
| | | | | 156/345.55 |
| 10,727,028 | B2* | 7/2020 | Torii | H03H 7/38 |
| 2001/0017524 | A1* | 8/2001 | Ishii | H01J 37/32082 |
| | | | | 315/111.41 |
| 2013/0119863 | A1* | 5/2013 | Hanawa | H01J 37/32183 |
| | | | | 315/111.21 |
| 2017/0062190 | A1* | 3/2017 | Lee | H01J 37/32532 |
| 2024/0363405 | A1* | 10/2024 | Sakamoto | C23C 16/52 |

* cited by examiner

<WITHOUT VOLTAGE WAVEFORM SHAPING UNIT (SWITCHING ELEMENT)>

<WITH VOLTAGE WAVEFORM SHAPING UNIT (SWITCHING ELEMENT)>

ON/OFF OF SWITCHING ELEMENT

PLASMA PROCESSING APPARATUS AND PLASMA PROCESSING METHOD

CROSS-REFERENCE TO RELATED APPLICATIONS

This application claims priority to Japanese Patent Application Nos. 2020-120879 and 2021-007232, respectively filed on Jul. 14, 2020, and Jan. 20, 2021, the entire contents of which are incorporated herein by reference.

TECHNICAL FIELD

The present disclosure relates to a plasma processing apparatus and a plasma processing method.

BACKGROUND

Plasma processing is processing that is often performed on a substrate such as a semiconductor wafer. Japanese Patent Application Publication No. 2000-306891 discloses a plasma processing apparatus including a vacuum chamber, a substrate electrode disposed in the vacuum chamber to place a substrate thereon, a radio frequency (RF) power supply being connected to the substrate electrode, and a ground electrode installed in the vacuum chamber. In the plasma processing apparatus, plasma is generated between the substrate electrode and the ground electrode. Further, Japanese Patent Application Publication No. 2000-306891 discloses connecting a potential adjusting mechanism having a diode to the substrate electrode.

SUMMARY

The present disclosure provides a plasma processing apparatus and a plasma processing method capable of performing plasma processing by efficiently generating plasma while suppressing an ion bombardment on a substrate.

In accordance with an aspect of the present disclosure, there is provided a plasma processing apparatus for performing plasma processing on a substrate, including: a processing chamber; a substrate support on which the substrate is placed, the substrate support being disposed in the processing chamber; a lower electrode provided in the substrate support, the lower electrode being grounded; an upper electrode disposed to face the lower electrode; a gas supply unit to supply a processing gas to a space between the upper electrode and the substrate support; a radio frequency power supply to apply RF power to the upper electrode to generate plasma of the processing gas; and a voltage waveform shaping unit provided between the RF power supply and the upper electrode to shape a voltage waveform of the RF power supply to suppress a positive voltage of the RF voltage applied to the upper electrode.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments will be described with reference to the accompanying drawings.

First Embodiment

First, a first embodiment (fundamental embodiment) will be described.

Figure 1:
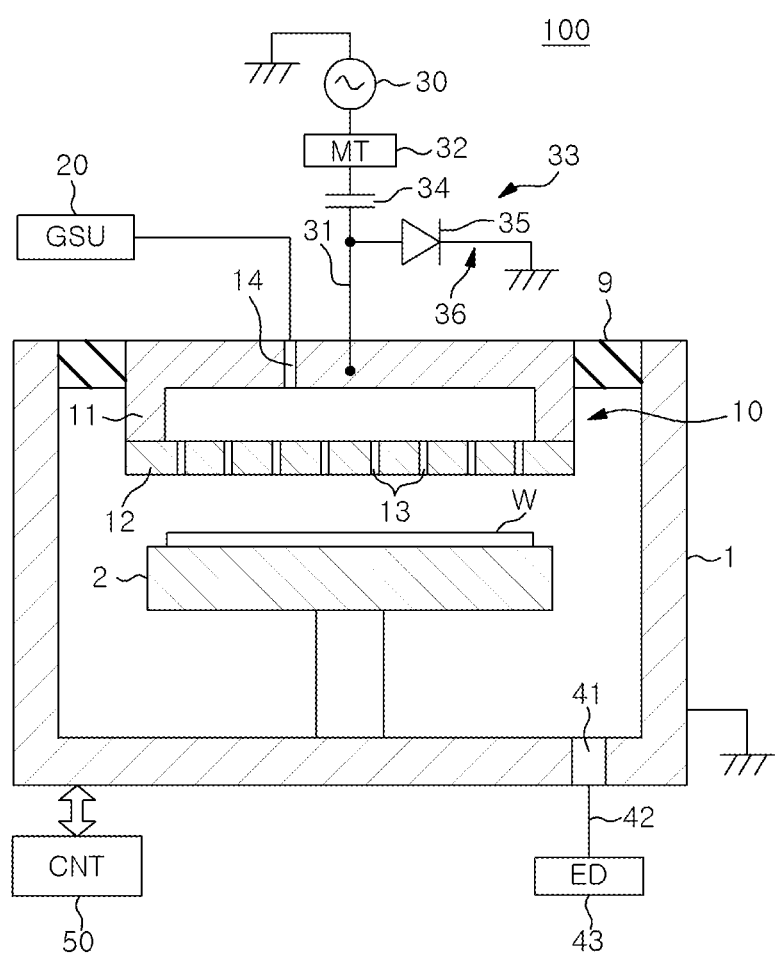
FIG. 1 is a cross-sectional view schematically showing a plasma processing apparatus according to a first embodiment.

FIG. 1 is a cross-sectional view schematically showing a plasma processing apparatus according to the first embodiment.

The plasma processing apparatus 100 performs plasma processing on a substrate W and is configured as a capacitively coupled plasma processing apparatus. Examples of the substrate W include, but are not limited to, a semiconductor wafer.

The plasma processing apparatus 100 has a metal processing chamber 1 having a substantially cylindrical shape. The processing chamber 1 is frame-grounded. In the processing chamber 1, a substrate support 2 for horizontally supporting the substrate W is disposed. The substrate support 2 includes a lower electrode that is grounded. In the illustrated example, the substrate support 2 is made of metal and serves as the lower electrode itself. Further, the substrate support 2 is grounded. Alternatively, the substrate support 2 may be made of an insulator and have a structure in which a grounded metal lower electrode is embedded.

The substrate support 2 may include a heating mechanism or a cooling mechanism depending on the plasma processing. Further, the substrate support 2 includes a plurality of lifting pins (not shown) that protrude beyond and retreat below an upper surface thereof. The lifting pins are vertically moved by a lifter (not shown) to transfer the substrate W to and from the substrate support 2.

An opening is formed in an upper part of the processing chamber 1, and a shower head 10 is fitted in the opening so as to face the substrate support 2 via an insulating member 9. The shower head 10 is made of metal and has a cylindrical shape as a whole. Further, the shower head 10 includes an upper electrode. In the illustrated example, the shower head 10 itself serves as the upper electrode. However, a part of the shower head 10 may serve as the upper electrode. The shower head 10 includes a main body 11 having an opening at a lower portion thereof and a shower plate 12 provided to close the opening of the main body 11. An internal space between the main body 11 and the shower plate 12 serves as a gas diffusion space. Further, a plurality of gas injection holes 13 are formed in the shower plate 12.

A gas inlet hole 14 is formed in the shower head 10, and a processing gas for plasma processing is supplied from a gas supply unit (GSU) 20 into the shower head 10 through the gas inlet hole 14. Then, the processing gas supplied into the shower head 10 is injected into the processing chamber 1 through the gas injection holes 13, and the processing gas is supplied into a space between the shower head 10 serving as the upper electrode and the substrate support 2 serving as the lower electrode.

The gas supply unit 20 is configured to supply various gases such as a processing gas for plasma processing, a plasma generating gas, and a purge gas. The processing gas is appropriately selected depending on the plasma processing to be performed. The gas supply unit 20 includes a plurality of gas sources and a plurality of gas supply pipes, and the gas supply pipes are provided with flow controllers such as valves and mass flow controllers.

A radio frequency (RF) power supply 30 is connected to substantially the center of the shower head 10 serving as the upper electrode through a power supply line 31. As an example of the RF power supply 30, one having a frequency of 10 kHz to 60 MHz may be used. By supplying RF power from the RF power supply 30 to the shower head 10 serving as the upper electrode, capacitively coupled plasma is generated between the shower head 10 serving as the upper electrode and the substrate support 2 serving as the lower electrode.

A matcher (MT) 32 is connected downstream of the RF power supply 30 of the power supply line 31. The matcher 32 matches a load impedance with an internal (or output) impedance of the RF power supply 30.

Between the RF power supply 30 and the upper electrode, a voltage waveform shaping unit 33 is provided downstream of the matcher 32 of the power supply line 31 to shape a voltage waveform of the RF power supply 30 so as to suppress a positive voltage (plus side voltage) of the RF voltage applied to the upper electrode. In the present embodiment, the voltage waveform shaping unit 33 includes a capacitor 34 that is disposed downstream of the matcher 32 and a ground circuit 36 that is branched downstream of the capacitor 34 and grounded through a diode 35. As an example of the capacitor 34, one having a sufficient capacitance such that the impedance becomes low when viewed from the RF power supply 30 may be used. Instead of the capacitor 34, a blocking capacitor of the matcher 32 may be used.

The voltage waveform shaping unit 33 has a charge storing function of the capacitor 34 and a rectifying function of the diode 35 of the ground circuit 36, so that the voltage waveform shaping unit 33 can be configured to allow the current to flow to the ground through the diode 35 when the RF power supply 30 outputs a positive voltage. At this time, the power output from the RF power supply 30 is stored in the capacitor 34. As a result, large fluctuation of the voltage of the upper electrode in the positive direction can be eliminated, and the increase of the plasma potential is suppressed. That is, by providing the voltage waveform shaping unit 33, the plasma potential can be decreased as compared with the case where the voltage waveform shaping unit 33 is not provided. In contrast, when the RF power supply 30 outputs a negative voltage, the power output from the RF power supply 30 and the power stored in the capacitor 34 are supplied (input) to the plasma. The power at this time is applied to the sheath of the upper electrode, which results in almost no effect on ion bombardment on the substrate W.

Further, when the plasma is excited while providing the voltage waveform shaping unit 33 having the diode 35, a high-density plasma region is generated and concentrated in the vicinity of the shower head 10 serving as the upper electrode. Therefore, the gas injected from the gas injection holes 13 of the shower head 10 inevitably passes through the high-density plasma region, and the gas is supplied to a process region after being efficiently turned into the plasma or radicalized.

An exhaust port 41 is formed at a bottom wall of the processing chamber 1, and an exhaust device (ED) 43 is connected to the exhaust port 41 through an exhaust pipe 42. The exhaust device 43 includes an automatic pressure control valve and a vacuum pump. The exhaust device 43 is configured to exhaust an inner space of the processing chamber 1 and maintain the pressure in the inner space of the processing chamber 1 at a desired vacuum level.

Although it is not illustrated, a loading/unloading port for loading and unloading the substrate W into and from the processing chamber 1 is formed at a sidewall of the processing chamber 1. The loading/unloading port is opened and closed by a gate valve.

Valves, flow controllers, RF power supplies and the like of the gas supply unit 20 that constitutes the plasma processing apparatus 100 are controlled by a controller (CNT) 50. The controller 50 includes a main control unit having a central processing unit (CPU), an input device, an output device, a display device, and a storage device. Then, a desired process of the plasma processing apparatus 100 is controlled based on a processing recipe stored in a storage medium of the storage device.

Next, an operation of the plasma processing apparatus 100 configured as described above will be described.

First, the gate valve is opened. Then, the substrate W is loaded into the processing chamber 1 through the loading/unloading port by a transfer device (not shown). Then, the substrate W is placed on the substrate support 2. Then, the transfer device is retracted and the gate valve is closed.

Next, after the pressure in the processing chamber 1 is adjusted, RF power is supplied from the RF power supply 30 to the shower head 10 serving as the upper electrode while introducing the processing gas into the processing chamber 1. As a result, a RF field is formed between the shower head (the upper electrode) 10 and the substrate support (the lower electrode) 2, and capacitively coupled plasma is generated therebetween.

Figure 2:
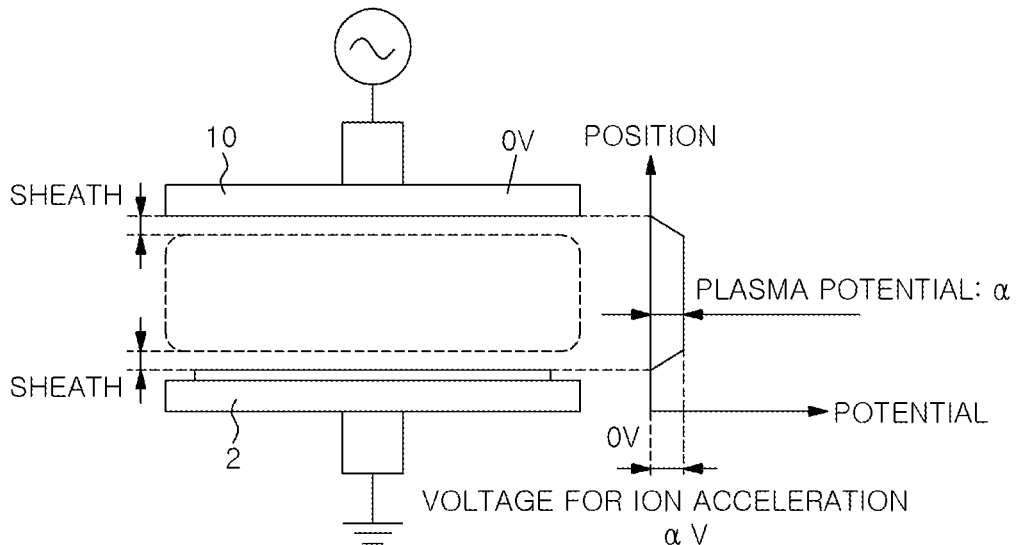
FIG. 2 shows a plasma potential at the moment when a potential of an upper electrode is 0 V in a general capacitively coupled plasma processing apparatus.
Figure 3:
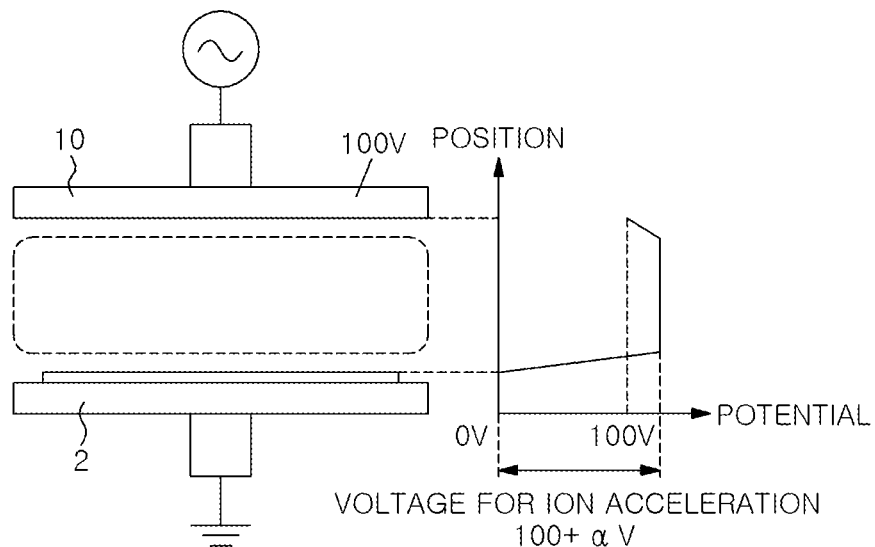
FIG. 3 shows a plasma potential at the moment when the potential of the upper electrode is 100 V in the general capacitively coupled plasma processing apparatus.

Here, in a general capacitively coupled plasma processing apparatus, when the lower electrode is grounded, the plasma potential largely depends on the potential of the upper electrode. As shown in FIG. 2, the plasma potential is a V at the moment when the potential of the upper electrode is 0 V. However, as shown in FIG. 3, the plasma potential is about "(100+α) V" at the moment when the potential of the upper electrode is 100 V.

Figure 4:
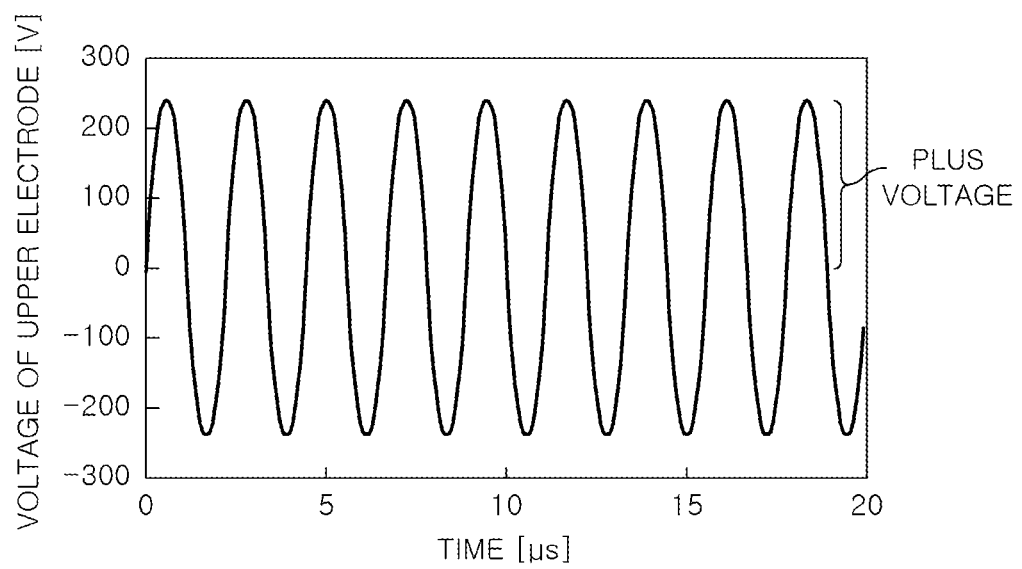
FIG. 4 shows a voltage waveform applied to the upper electrode in the general capacitively coupled plasma processing apparatus.
Figure 5:
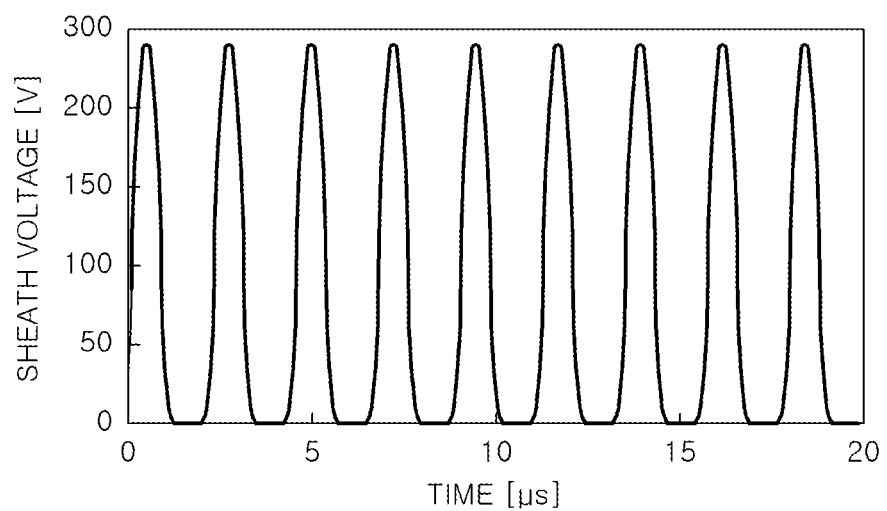
FIG. 5 shows an approximate sheath voltage in the general capacitively coupled plasma processing apparatus.

Ions in the plasma are accelerated toward the substrate W by a sheath voltage (difference between the plasma potential and the substrate potential) above an upper surface of the substrate. As shown in FIG. 4, a sinusoidal waveform is applied to the upper electrode. In this circumstance, if the power applied from the RF power supply 30 is increased in order to increase the intensity of the generated plasma, a high voltage is also applied in the positive direction. Therefore, as shown in FIG. 5, the plasma potential is increased (rises) in the positive direction, so that the sheath voltage becomes high, the acceleration of the ions becomes larger, and the ion bombardment on the substrate W becomes stronger.

Therefore, in the present embodiment, a voltage waveform shaping unit 33, which shapes the voltage waveform of the RF power supply to suppress the positive voltage (plus side voltage) of the RF voltage applied to the upper electrode, is provided downstream of the matcher 32.

In the present embodiment, the voltage waveform shaping unit 33 specifically operates as follows with the charge storing function of the capacitor 34 and the rectifying function of the diode 35 of the ground circuit 36. First, when the RF power supply 30 outputs a positive voltage, the current passes through the diode 35 and flows to the ground. At this time, the power output from the RF power supply 30 is stored in the capacitor 34. As a result, large fluctuation of the voltage of the upper electrode in the positive direction can be eliminated, and the increase of the plasma potential is suppressed. Therefore, the ion bombardment on the substrate W can be reduced. In contrast, when the RF power supply 30 outputs a negative voltage, the power output from the RF power supply 30 and the power stored in the capacitor 34 are supplied to the plasma. The power at this time is applied to the sheath of the upper electrode, which results in no effect on the ion bombardment on the substrate W.

Figure 6:
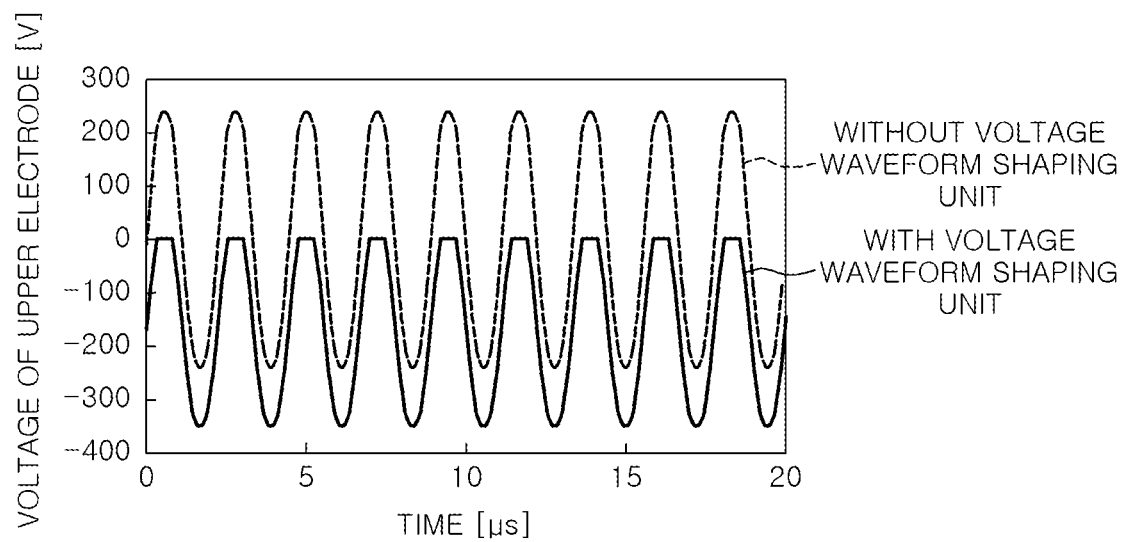
FIG. 6 shows a voltage waveform of the upper electrode in each of the plasma processing apparatus of FIG. 1 and the general capacitively coupled plasma processing apparatus.

FIG. 6 shows a voltage waveform of the upper electrode in each of the plasma processing apparatus shown in FIG. 1 that is provided with the voltage waveform shaping unit 33 and the general capacitively coupled plasma processing apparatus that is not provided with the voltage waveform shaping unit 33. As shown in FIG. 6, by providing the voltage waveform shaping unit 33, it is possible to eliminate the large fluctuation of the voltage of the upper electrode in the positive direction, which occurs when the voltage waveform shaping unit 33 is not provided. Thus, the increase of the plasma potential can be suppressed. As a result, the ion bombardment on the substrate W can be suppressed. That is, the control of the plasma intensity and the suppression of the ion bombardment on the substrate W can be performed independently.

Figure 7:
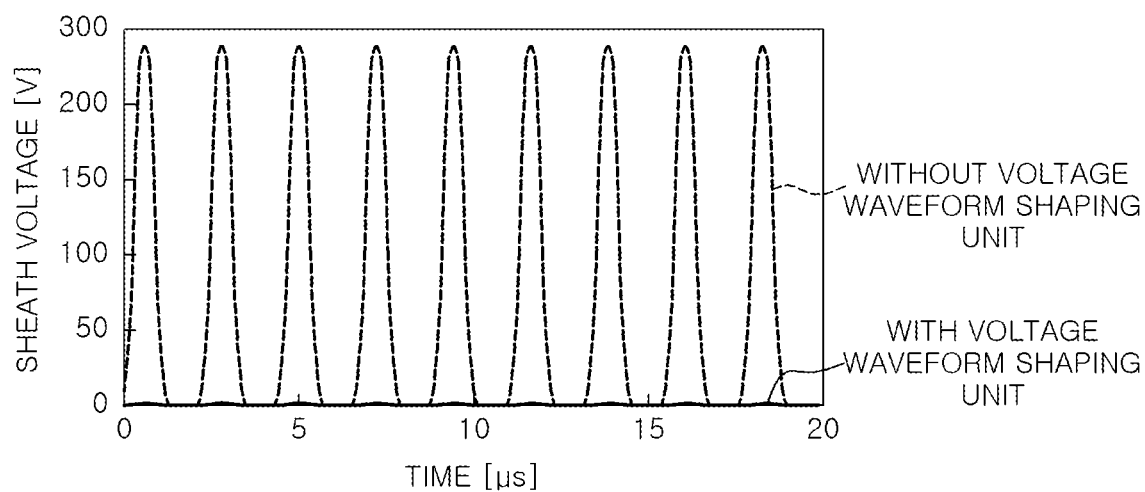
FIG. 7 shows an approximate sheath voltage for ion acceleration in each of the plasma processing apparatus of FIG. 1 and the general capacitively coupled plasma processing apparatus.

FIG. 7 shows a result of deriving the sheath voltage for ion acceleration by a simple calculation in each case of the plasma processing apparatus of FIG. 1 provided with the voltage waveform shaping unit 33 and the general capacitively coupled plasma processing apparatus provided without the voltage waveform shaping unit 33. As shown in FIG. 7, it was found that the sheath voltage was reduced to near 0 V and the ion bombardment on the substrate W could be reduced by providing the voltage waveform shaping unit 33.

Figure 8:
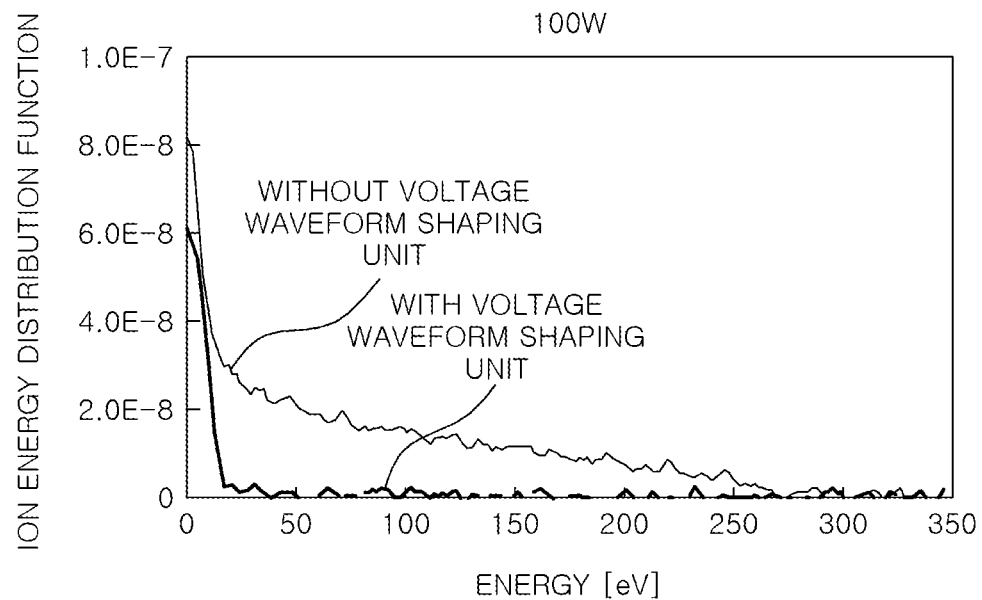
FIG. 8 shows ion energy distribution when an output power of a RF power supply is 100 W in each of the plasma processing apparatus of FIG. 1 and the general capacitively coupled plasma processing apparatus.
Figure 9:
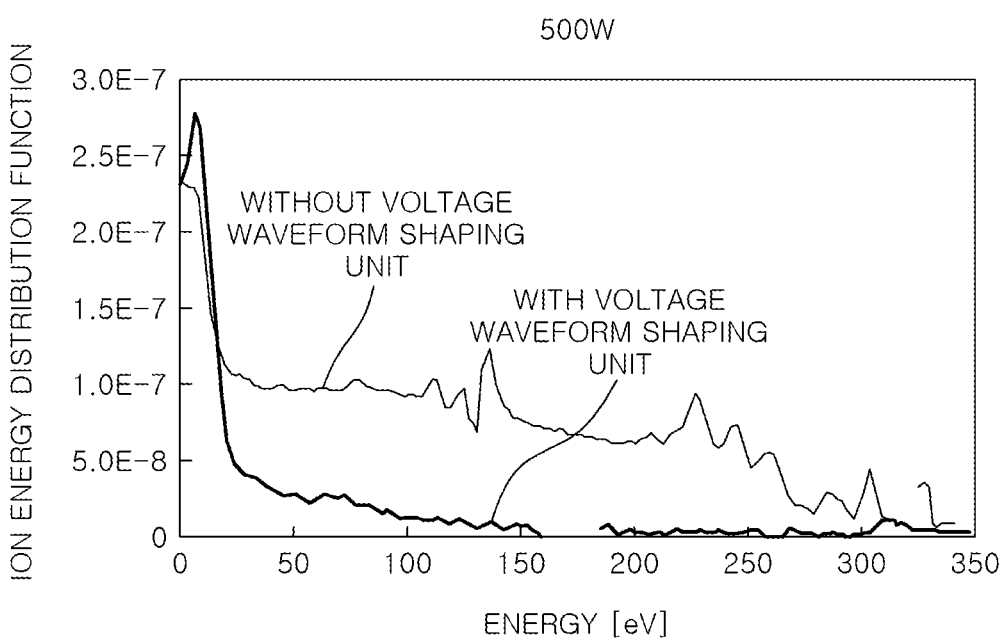
FIG. 9 shows ion energy distribution when the output power of the RF power supply is 500 W in each of the plasma processing apparatus of FIG. 1 and the general capacitively coupled plasma processing apparatus.

Next, a result of actual measurement of an ion energy in each of the plasma processing apparatus of FIG. 1 provided with the voltage waveform shaping unit 33 and the general capacitively coupled plasma processing apparatus provided without the voltage waveform shaping unit 33 will be described. FIG. 8 shows ion energy distribution when an output power of the RF power supply 30 is 100 W. FIG. 9 shows ion energy distribution when the output power of the RF power supply 30 is 500 W. As shown in FIGS. 8 and 9, it was found in the actual evaluation that the ion energy was reduced by providing the voltage waveform shaping unit 33.

Figure 10:
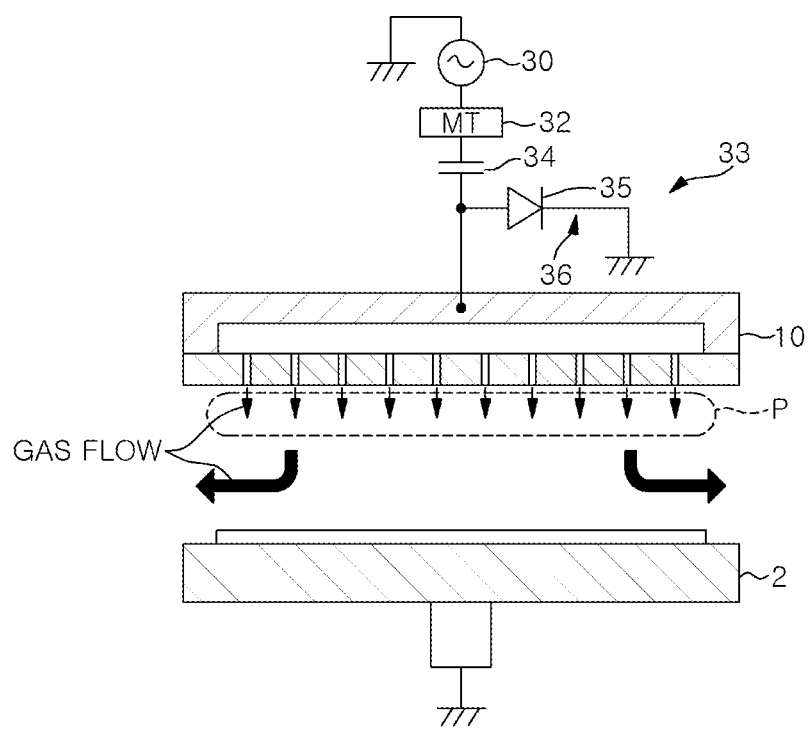
FIG. 10 shows a flow of gas and plasma generated when the plasma is excited in the plasma processing apparatus of FIG. 1.

Further, when the plasma is excited with the voltage waveform shaping unit 33 having the diode 35 provided, the voltage of the upper electrode does not fluctuate (swing) in the positive (plus) direction. Therefore, as shown in FIG. 10, a high-density plasma region P is generated and concentrated in the vicinity of the shower head serving as the upper electrode 10. Therefore, the gas injected from the gas injection holes 13 of the shower head 10 inevitably passes through the high-density plasma region P, and the gas is supplied to the process region after being efficiently turned into the plasma or radicalized. Further, since the power from the RF power supply 30 is input to the high-density plasma region P that is generated and concentrated in the vicinity of the shower head 10, it is also highly efficient in terms of power.

Figure 11:
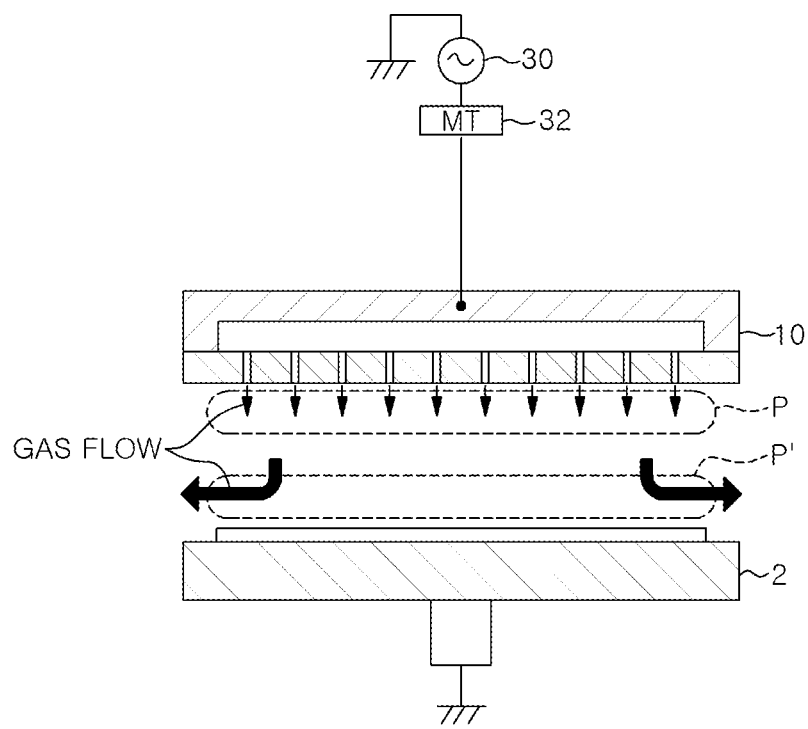
FIG. 11 shows a flow of gas and plasma generated when the plasma is excited in the general capacitively coupled plasma processing apparatus.

On the other hand, as shown in FIG. 11, when the voltage waveform shaping unit 33 is not provided, a high-density plasma region P' is also generated in the vicinity of the substrate support 2 serving as the lower electrode, in addition to the high-density plasma region P generated in the vicinity of the upper electrode. Further, the input power is distributed to the high-density plasma region P and the high-density plasma region P'. Therefore, the density of the high-density plasma region P in the vicinity of the upper electrode, through which the gas injected from the gas injection holes 13 of the shower head 10 inevitably passes, is reduced as compared with the case where the voltage waveform shaping unit 33 is provided. Therefore, the efficiency of radical generation is lowered.

Figure 12:
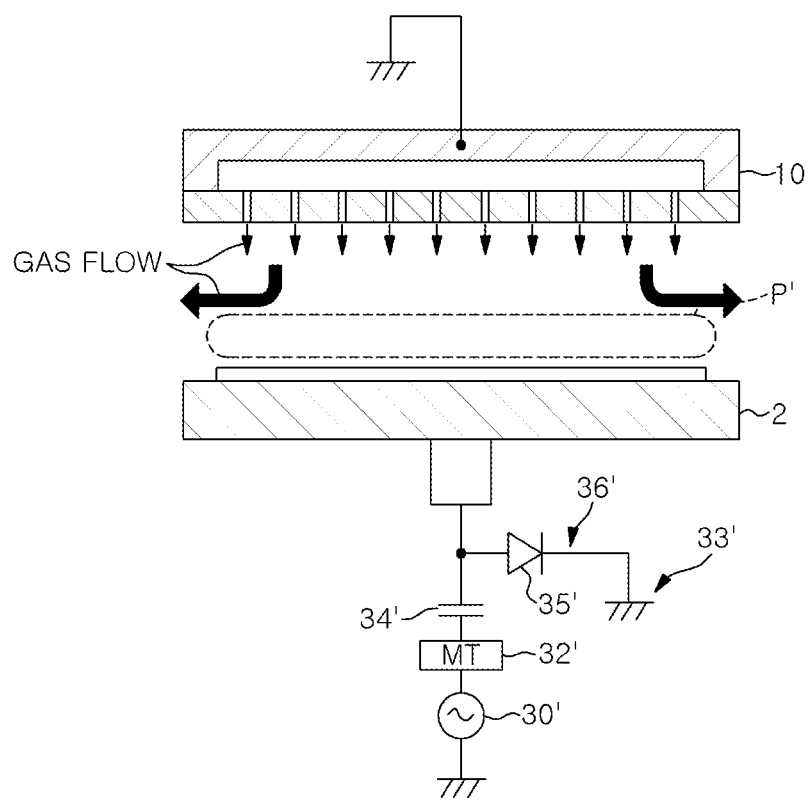
FIG. 12 shows a flow of gas and plasma generated when the plasma is excited in a plasma processing apparatus in which a RF power supply is connected to a lower electrode and a voltage waveform shaping unit is provided on the lower electrode side.

Further, in a configuration shown in FIG. 12 that is similar to a configuration described in Japanese Patent Application Publication No. 2000-306891, a RF power supply 30' is connected to the substrate support 2 serving as the lower electrode, and a voltage waveform shaping unit 33' is provided on the lower electrode side while the voltage waveform shaping unit 33' has a capacitor 34' disposed downstream of a matcher (MT) 32' and a ground circuit 36' grounded through a diode 35'. In this configuration, the plasma P' is generated and concentrated near the substrate support 2. Therefore, some of the gas is exhausted from the process space without coming into contact with the high-density plasma region P', so that the efficiency of radical generation is lowered.

As described above, in the first embodiment, the plasma processing can be performed by efficiently generating the plasma while suppressing the ion bombardment on the substrate W.

Second Embodiment

Next, a second embodiment will be described.

Figure 13:
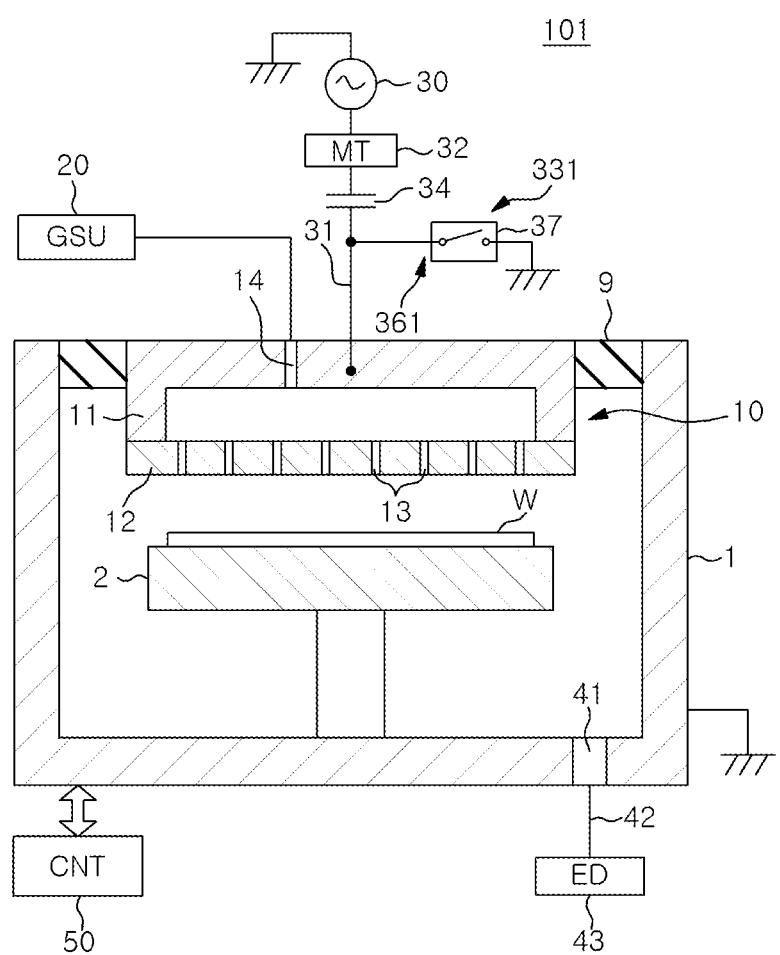
FIG. 13 is a cross-sectional view schematically showing a plasma processing apparatus according to a second embodiment.

FIG. 13 is a cross-sectional view schematically showing a plasma processing apparatus according to the second embodiment.

The plasma processing apparatus 101 according to the second embodiment is also a fundamental embodiment similar to the plasma processing apparatus 100 according to the first embodiment. The plasma processing apparatus 101 of the second embodiment is different from the plasma processing apparatus 100 only in that a voltage waveform shaping unit 331 having a different structure is provided instead of the voltage waveform shaping unit 33 of the first embodiment. Therefore, in FIG. 13, the same reference numeral will be given to the same parts as those in FIG. 1 and the description thereof will be omitted.

The voltage waveform shaping unit 331 is provided downstream of the matcher 32 of the power supply line 31 to shape a voltage waveform of the RF power supply so as to suppress a positive voltage (plus side voltage) of the RF voltage applied to the upper electrode. In the second embodiment, the voltage waveform shaping unit 331 includes the capacitor 34 that is disposed downstream of the matcher 32 and a ground circuit 361 that is branched downstream of the capacitor 34 and grounded through a switching element 37. That is, in the second embodiment, instead of the diode 35 of the first embodiment, the switching element 37 is provided as an element having a function of selectively flowing a current to the ground when a positive voltage is applied to the upper electrode. The blocking capacitor of the matcher 32 may be used as the capacitor 34. Further, the switching element 37 may be a mechanical relay or a semiconductor switch such as a transistor.

The voltage waveform shaping unit 331 has a charge storing function of the capacitor 34 and an opening and closing function of the switching element 37 of the ground circuit 361, so that the current is made to flow to the ground when the RF power supply 30 outputs a positive voltage. That is, the switching element 37 can have the same function as the diode 35 in the first embodiment in such a manner that, for example, the switching element 37 is opened and closed when the voltage waveform approaches 0 V, and the current flows to the ground when the RF power supply 30 outputs the positive voltage. At this time, the power output from the RF power supply 30 is stored in the capacitor 34. As a result, large fluctuation of the voltage of the upper electrode in the positive direction can be eliminated, and the increase of the plasma potential is suppressed. In contrast, when the RF power supply 30 outputs a negative voltage, the power output from the RF power supply 30 and the power stored in the capacitor 34 are supplied (input) to the plasma. The power at this time is applied to the sheath of the upper electrode, which results in almost no effect on the ion bombardment on the substrate W.

Figure 14A:
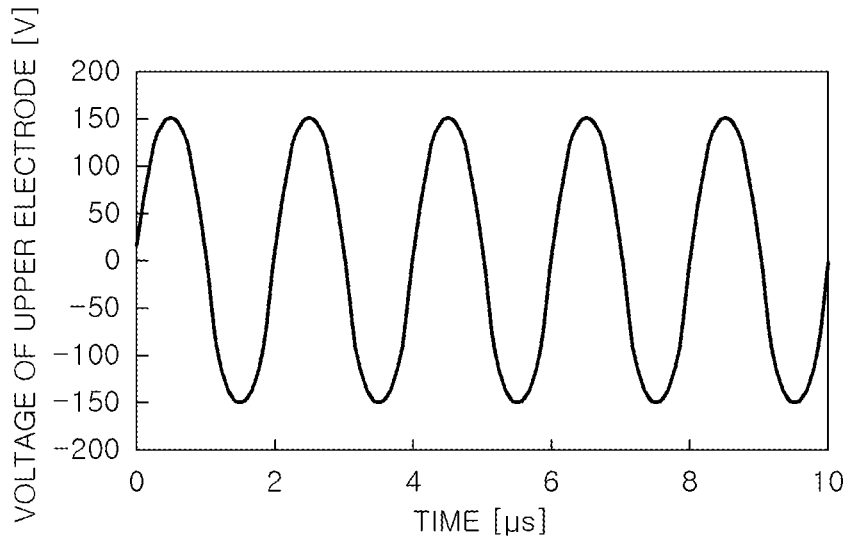
FIGS. 14A and 14B respectively show a voltage waveform of the upper electrode of the general capacitively coupled plasma processing apparatus and a voltage waveform of the upper electrode when a switching element of the voltage waveform shaping unit is appropriately opened and closed.
Figure 14B:
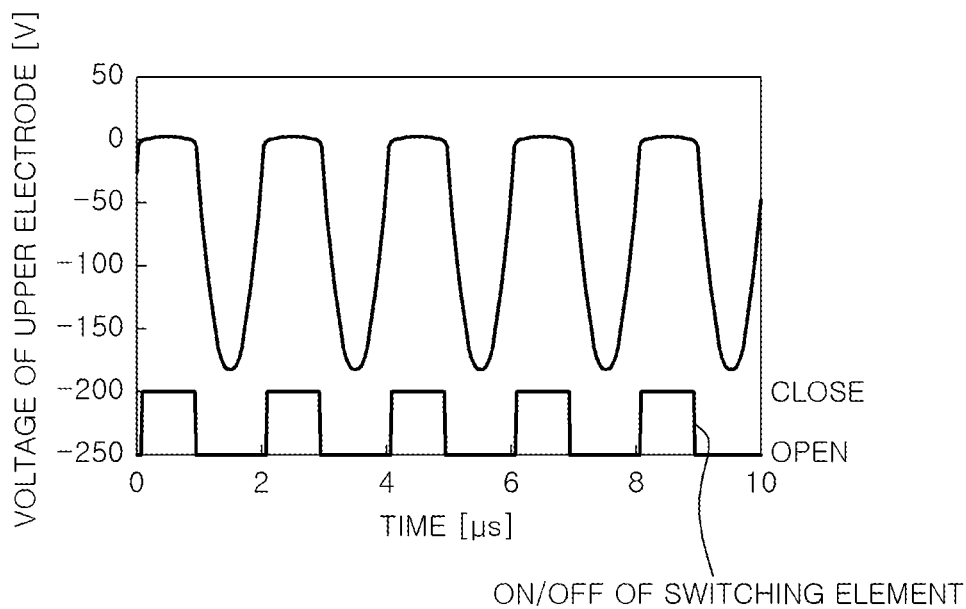

FIG. 14A shows a voltage waveform of the upper electrode of the general capacitively coupled plasma processing apparatus provided without the voltage waveform shaping unit 331 and FIG. 14B shows a voltage waveform of the upper electrode when the switching element 37 of the voltage waveform shaping unit 331 is appropriately opened and closed. As shown in FIGS. 14A and 14B, by appropriately opening and closing the switching element 37 of the voltage waveform shaping unit 331, it was found that the large fluctuation of the voltage of the upper electrode in the positive direction could be eliminated and the increase of the plasma potential could be suppressed. As a result, the ion bombardment on the substrate W can be suppressed.

Further, as in the first embodiment, the gas is supplied to the process region after being efficiently turned into the plasma or radicalized in the second embodiment.

Third Embodiment

Next, a third embodiment will be described.

Figure 15:
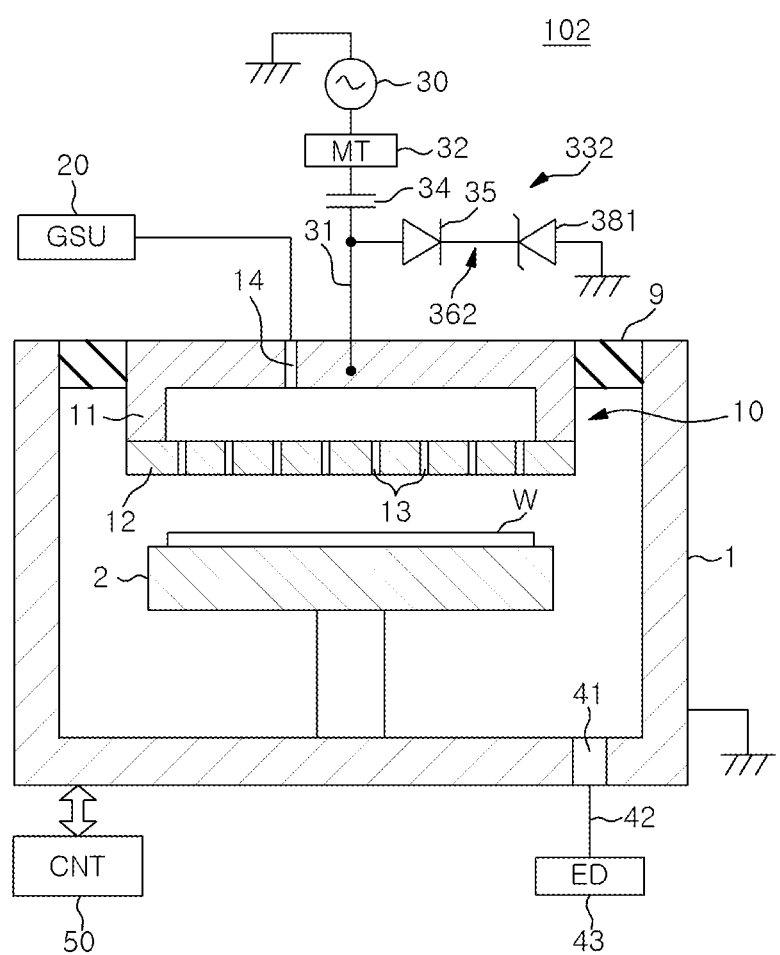
FIG. 15 is a cross-sectional view schematically showing a plasma processing apparatus according to a third embodiment.

FIG. 15 is a cross-sectional view schematically showing a plasma processing apparatus according to the third embodiment.

The plasma processing apparatus 102 according to the third embodiment is different from the plasma processing apparatus 100 of the first embodiment only in that a voltage waveform shaping unit 332 having a Zener diode 381 as a voltage adjuster for adjusting the voltage applied to the upper electrode is provided instead of the voltage waveform shaping unit 33 of the first embodiment. Therefore, in FIG. 15, the same reference numeral will be given to the same parts as those in FIG. 1 and the description thereof will be omitted.

The voltage waveform shaping unit 332 is provided downstream of the matcher 32 of the power supply line 31 to shape a voltage waveform so that the voltage waveform in which a positive voltage (plus side voltage) of the RF voltage applied to the upper electrode has an arbitrarily determined upper limit is obtained while the positive voltage of the upper electrode is suppressed. In the third embodiment, the voltage waveform shaping unit 332 includes the capacitor 34 that is disposed downstream of the matcher 32 and a ground circuit 362 that is branched downstream of the capacitor 34. The ground circuit 362 includes the diode 35 and the Zener diode 381 serving as the voltage adjuster connected in series with the diode 35. The ground circuit 362 is grounded through the diode 35 and the Zener diode 381.

The Zener diode 381 has a function of permitting a current to start flowing when the voltage reaches a predetermined value (Zener voltage Vz) such that a voltage higher than the predetermined value is not applied (that is, the voltage across the Zener diode remains fixed). With such function, the function of the diode 35 can be mitigated, and the upper limit of the positive voltage (plus side voltage) of the upper electrode (shower head 10) can be arbitrarily determined. That is, by adjusting the Zener voltage Vz, the positive voltage applied to the upper electrode can be arbitrarily changed to adjust the plasma potential, and the ion energy supplied to the substrate W can be appropriately adjusted.

Figure 16:
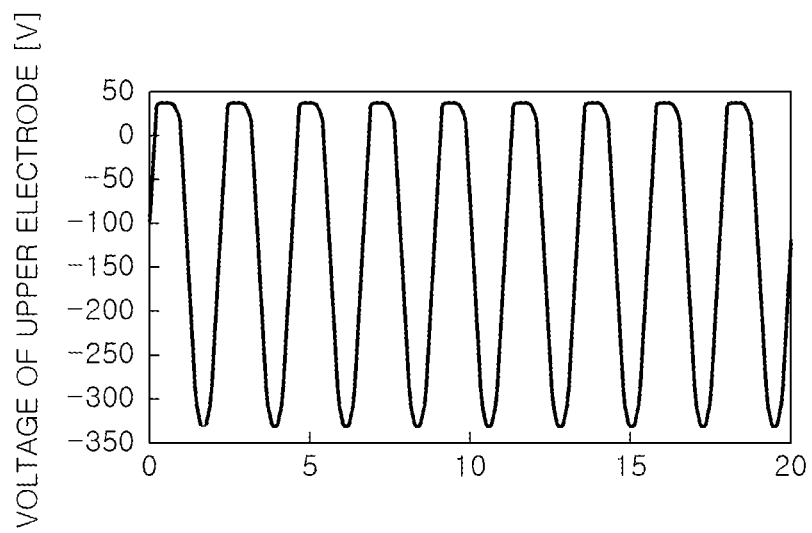
FIG. 16 shows a voltage waveform of the upper electrode in the plasma processing apparatus of FIG. 15.

FIG. 16 shows a voltage waveform of the upper electrode in the case where the Zener diode 381 having a Zener voltage Vz of 39 V is used in the plasma processing apparatus having the ground circuit 362 provided with the diode 35 and the Zener diode 381 of FIG. 15. As shown in FIG. 16, it was found that the maximum of the positive voltage (plus side voltage) of the upper electrode could be set to about the Zener voltage Vz by using the ground circuit 362 having the diode 35 and the Zener diode 381.

Figure 17:
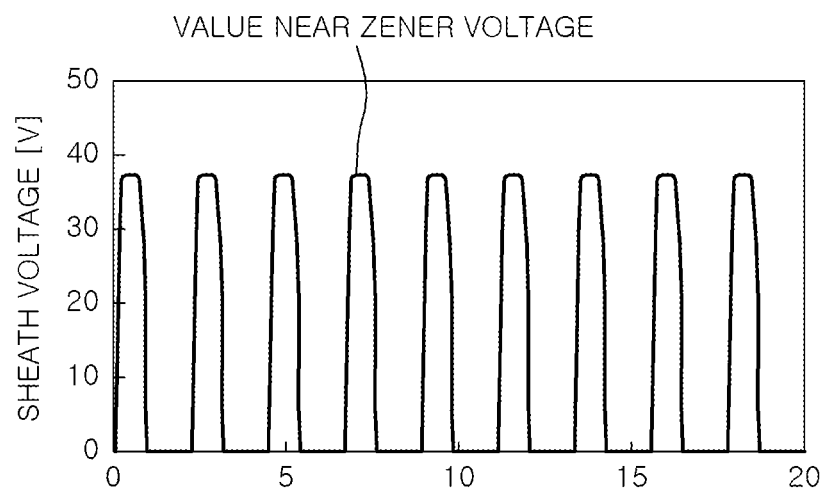
FIG. 17 shows a sheath voltage in the plasma processing apparatus of FIG. 15.

FIG. 17 shows a result of deriving the sheath voltage for ion acceleration the ions by a simple calculation in the plasma processing apparatus of FIG. 15. As shown in FIG. 17, it was found that a value near the Zener voltage Vz could be taken as the sheath voltage and the ion energy to the substrate W could be adjusted by providing the voltage waveform shaping unit 332 having the ground circuit 362 provided with the diode 35 and the Zener diode 381.

Further, in the third embodiment as well, since the voltage of the upper electrode in the positive direction is suppressed, the effect that the supplied gas is efficiently turned into plasma or radicalized can be maintained.

Figure 18:
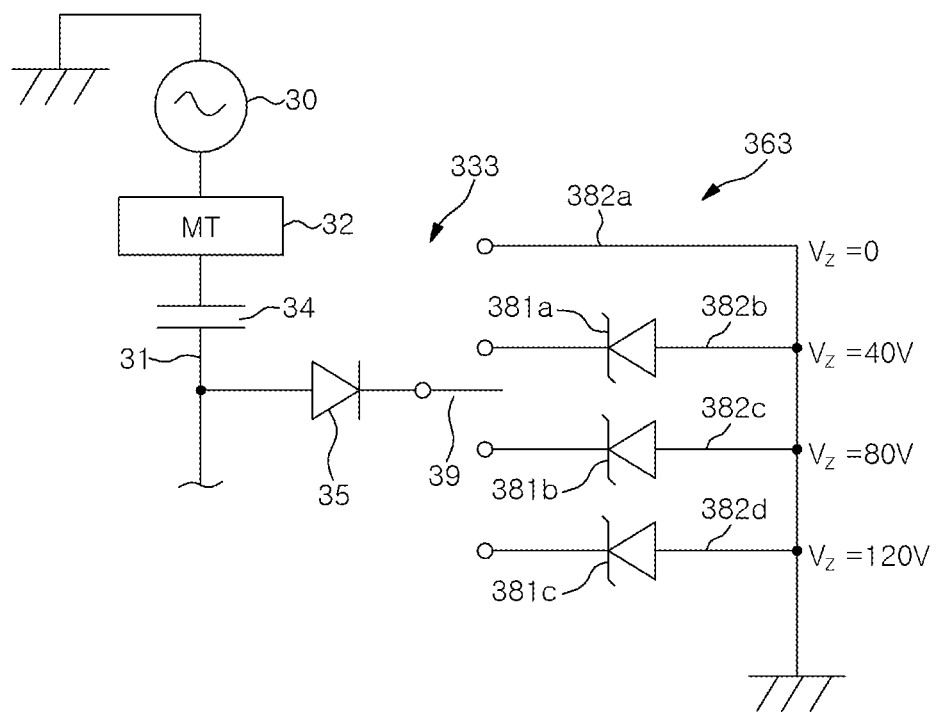
FIG. 18 shows another example of a voltage waveform shaping unit in the plasma processing apparatus of the third embodiment.

In the third embodiment, as an alternative example, a voltage waveform shaping unit 333 having a function of switching the Zener voltage to a different value to switch the upper limit of the positive voltage of the upper electrode may be provided. FIG. 18 shows a configuration of the voltage waveform shaping unit 333. The voltage waveform shaping unit 333 includes a ground circuit 363 having a plurality of grounded lines having different Zener voltages, which can be switched by a switch 39. The ground circuit 363 is disposed downstream of the diode 35. In this example, the plurality of lines includes a first line 382a without a Zener diode (Vz=0), a second line 382b with a first Zener diode 381a (Vz=40), a third line 382c with a second Zener diode 381b (Vz=80), and a fourth line 382d with a third Zener diode 381c (Vz=120). The Zener voltage Vz of each line is merely an example and is not limited thereto.

With such a configuration, the Zener diodes having different Zener voltages Vz are respectively provided in the lines and are switched by a switch. Therefore, the upper limit of the positive voltage of the upper electrode (shower head 10) can be switched in a plurality of stages. As a result, the ion energy supplied to the substrate W can be controlled only by the switching operation of the switch.

Further, as another alternative example in the third embodiment, the switching element of the second embodiment may be used instead of the diode 35.

Fourth Embodiment

Next, a fourth embodiment will be described.

Figure 19:
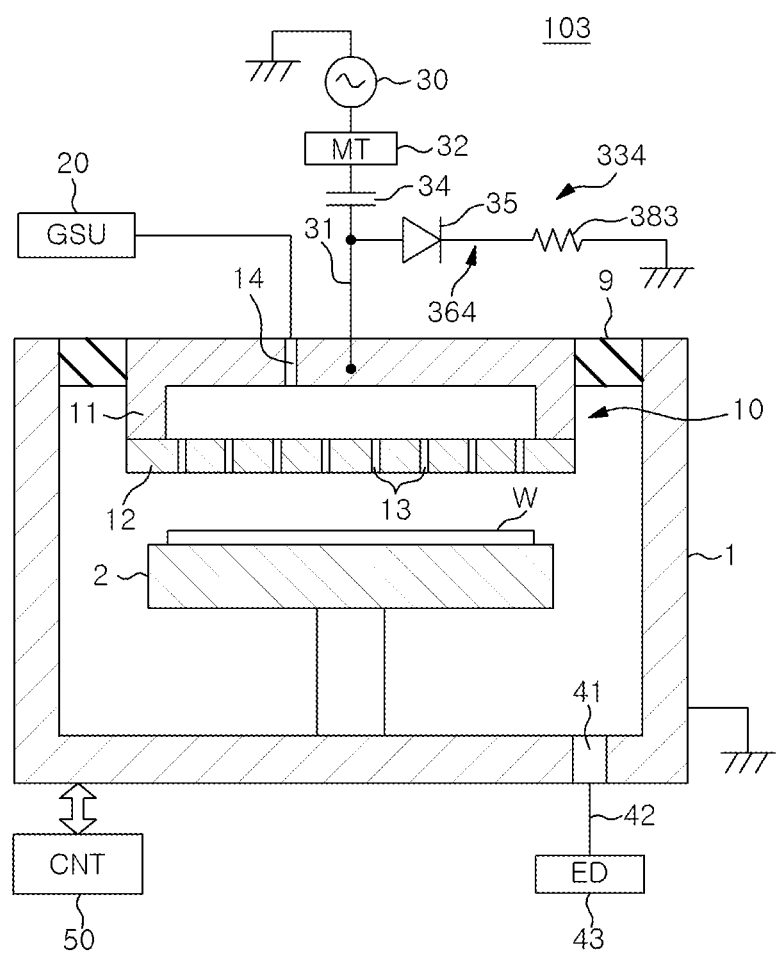
FIG. 19 is a cross-sectional view schematically showing a plasma processing apparatus according to a fourth embodiment.

FIG. 19 is a cross-sectional view schematically showing a plasma processing apparatus according to the fourth embodiment.

The plasma processing apparatus 103 according to the fourth embodiment is different from the plasma processing apparatus 100 of the first embodiment only in that a voltage waveform shaping unit 334 having a resistor 383 as the voltage adjuster is provided. Therefore, in FIG. 19, the same reference numeral will be given to the same parts as those in FIG. 1 and the description thereof will be omitted.

The voltage waveform shaping unit 334 is provided downstream of the matcher 32 of the power supply line 31 to shape a voltage waveform so that the voltage waveform in which a positive voltage (plus side voltage) of the RF voltage applied to the upper electrode has an arbitrarily determined upper limit is obtained while the positive voltage of the upper electrode is suppressed. In the fourth embodiment, the voltage waveform shaping unit 334 includes the capacitor 34 that is disposed downstream of the matcher 32 and a ground circuit 364 that is branched downstream of the capacitor 34. The ground circuit 364 includes the diode 35 and the resistor 383 serving as the voltage adjuster provided in series with the diode 35. The ground circuit 364 is grounded through the diode 35 and the resistor 383.

The upper limit of the positive voltage (plus side voltage) of the upper electrode (shower head 10) can be arbitrarily determined by the resistor 383. That is, by adjusting the resistance value of the resistor 383, the positive voltage applied to the upper electrode can be arbitrarily changed to adjust the plasma potential, and the ion energy supplied to the substrate W can be appropriately adjusted. Accordingly, an appropriate amount of ions can be supplied to the substrate W depending on the plasma processing.

Further, in the fourth embodiment as well, since the voltage of the upper electrode in the positive direction is suppressed, the effect that the supplied gas is efficiently turned into plasma or radicalized can be maintained.

Figure 20:
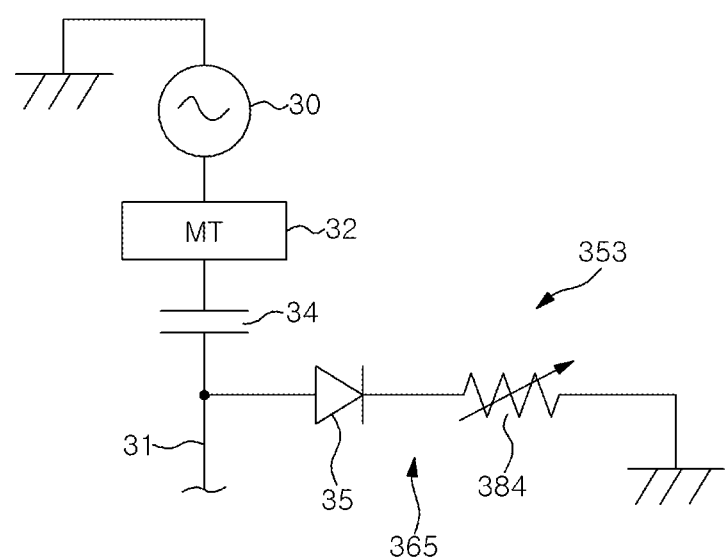
FIG. 20 shows another example of a voltage waveform shaping unit in the plasma processing apparatus of the fourth embodiment.

In the fourth embodiment, as an alternative example, the resistor may be a variable resistor. FIG. 20 shows a configuration of a voltage waveform shaping unit 335 having a ground circuit 365 provided with a variable resistor 384 instead of the resistor 383. By providing the variable resistor 384, the ion energy supplied to the substrate W can be controlled only by switching the resistance value of the variable resistor 384.

Further, as another alternative example in the fourth embodiment, the switching element of the second embodiment may be used instead of the diode 35.

Fifth Embodiment

Next, a fifth embodiment will be described.

Figure 21:
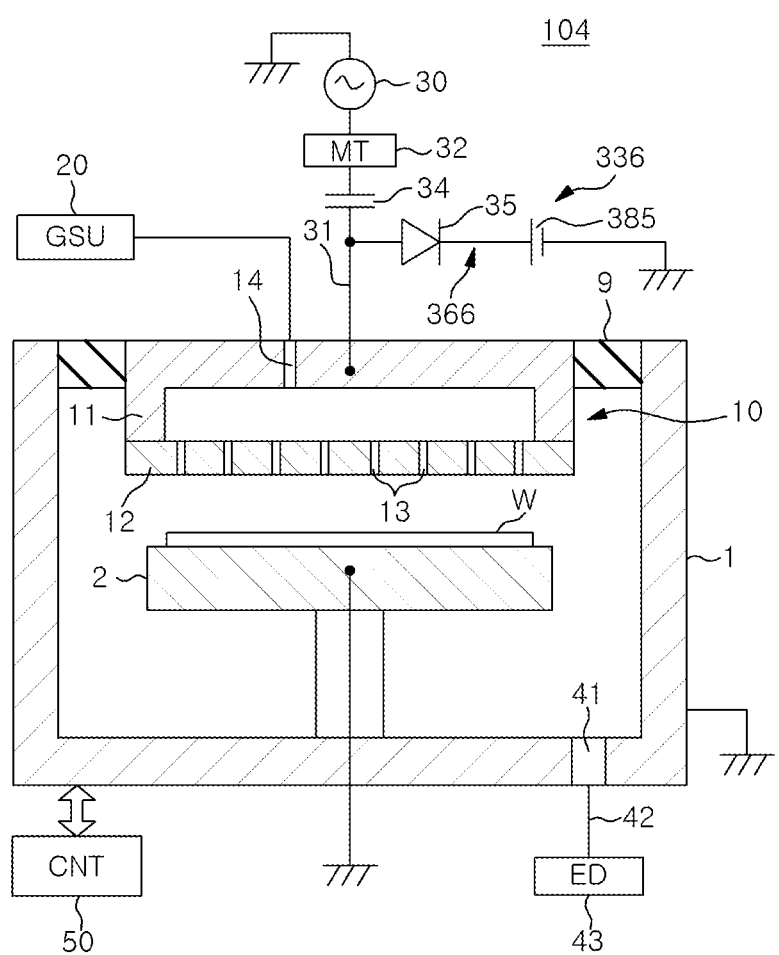
FIG. 21 is a cross-sectional view schematically showing a plasma processing apparatus according to a fifth embodiment.

FIG. 21 is a cross-sectional view schematically showing a plasma processing apparatus according to the fifth embodiment.

The plasma processing apparatus 104 according to the fifth embodiment is different from the plasma processing apparatus 100 of the first embodiment only in that a voltage waveform shaping unit 336 having a power supply 385 as the voltage adjuster is provided. Therefore, in FIG. 21, the same reference numeral will be given to the same parts as those in FIG. 1 and the description thereof will be omitted.

The voltage waveform shaping unit 336 is provided downstream of the matcher 32 of the power supply line 31 to shape a voltage waveform so that the voltage waveform in which a positive voltage (plus side voltage) of the RF voltage applied to the upper electrode has an arbitrarily determined upper limit is obtained while the positive voltage of the upper electrode is suppressed. In the fifth embodiment, the voltage waveform shaping unit 336 includes the capacitor 34 that is disposed downstream of the matcher 32 and a ground circuit 366 that is branched downstream of the capacitor 34. The ground circuit 366 includes the diode 35 and the power supply 385 serving as the voltage adjuster provided in series with the diode 35. The ground circuit 366 is grounded through the diode 35 and the power supply 385. In this example, a DC power supply is provided as the power supply 385.

The upper limit of the positive voltage (plus side voltage) of the upper electrode (shower head 10) can be arbitrarily determined by the power supply 385. That is, by adjusting the voltage of the power supply 385, the positive voltage applied to the upper electrode can be arbitrarily changed to adjust the plasma potential, and the ion energy supplied to the substrate W can be appropriately adjusted.

Further, in the fifth embodiment as well, since the voltage of the upper electrode in the positive direction is suppressed, the effect that the supplied gas is efficiently turned into plasma or radicalized can be maintained.

Figure 22:
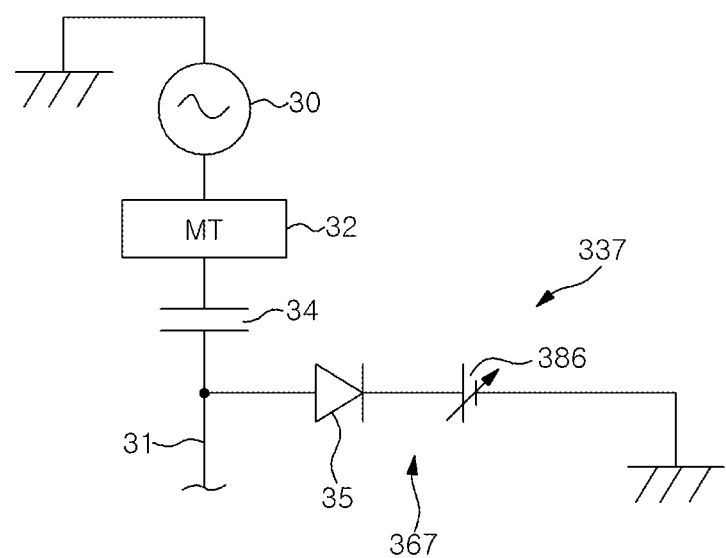
FIG. 22 shows another example of a voltage waveform shaping unit in the plasma processing apparatus of the fifth embodiment.

In the fifth embodiment, as an alternative example, the power supply may be a variable power supply. FIG. 22 shows a configuration of a voltage waveform shaping unit 337 having a ground circuit 367 provided with a variable power supply 386 instead of the power supply 385. By providing the variable power supply 386, the ion energy supplied to the substrate W can be controlled only by switching the voltage value of the variable power supply 386.

Further, as another alternative example in the fifth embodiment, the switching element of the second embodiment may be used instead of the diode 35.

Sixth Embodiment

Next, a sixth embodiment that is a specific embodiment will be described.

In the sixth embodiment, a case where a plasma processing apparatus having the structure shown in the first embodiment is applied to a film forming apparatus is illustrated.

Figure 23:
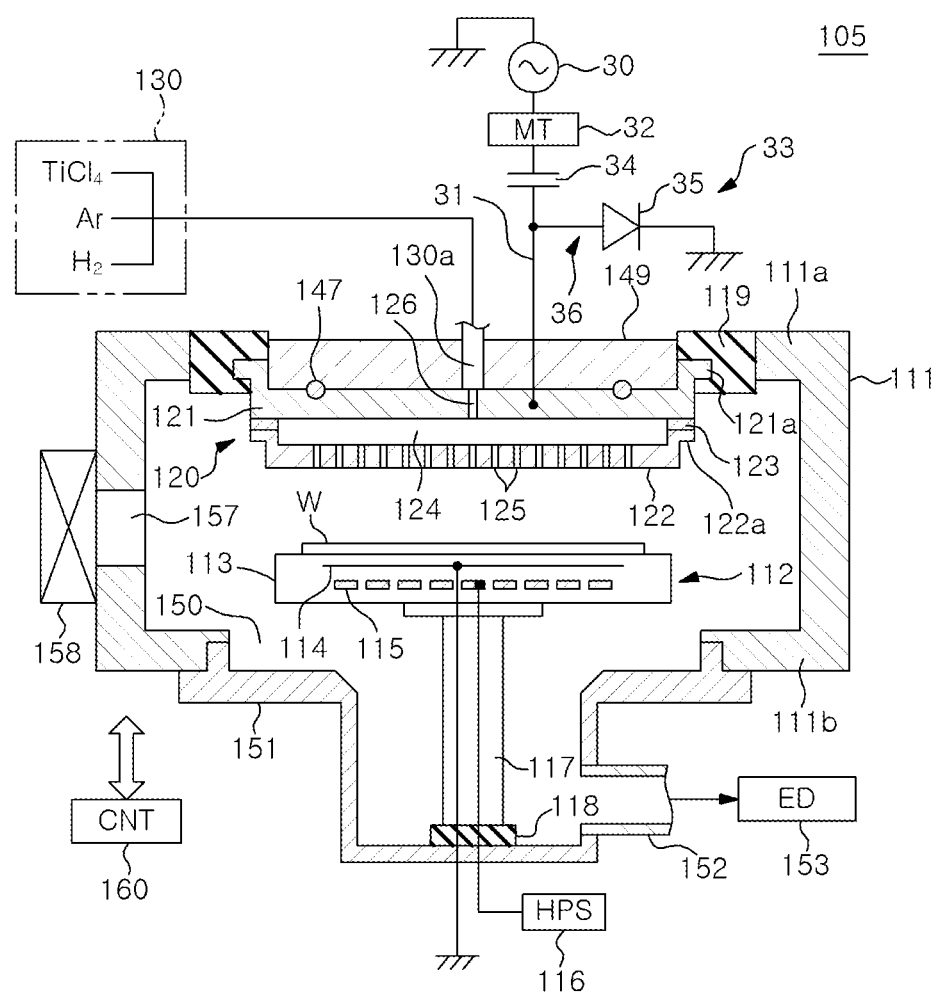
FIG. 23 is a cross-sectional view showing a plasma processing apparatus according to a sixth embodiment.

FIG. 23 is a cross-sectional view showing the plasma processing apparatus according to the sixth embodiment.

The plasma processing apparatus 105 is provided to form a Ti film on the substrate W by plasma CVD. Further, the plasma processing apparatus 105 is configured as a capacitively coupled plasma processing apparatus. Examples of the substrate W include, but are not limited to, a semiconductor wafer.

The plasma processing apparatus 105 has a metal processing chamber 111 having a substantially cylindrical shape. The processing chamber 111 includes an exhaust chamber 151 extending downward from a bottom wall 111*b* of a main body of the processing chamber 111 and covers a circular hole 150 formed in a central portion of the bottom wall 111*b*.

An exhaust pipe 152 is connected to a side surface of the exhaust chamber 151, and an exhaust device (ED) 153 including an automatic pressure control valve and a vacuum pump is provided on the exhaust pipe 152. The exhaust device 153 is configured to exhaust an inner space of the processing chamber 111 and maintain the pressure in the inner space of the processing chamber 111 at a desired vacuum level.

A loading/unloading port 157 for loading and unloading the substrate W into and from the processing chamber 111 is formed at a sidewall of the processing chamber 111. The loading/unloading port 157 is opened and closed by a gate valve 158.

In the processing chamber 111, a substrate support 112 for horizontally supporting the substrate W is disposed. The substrate support 112 includes a main body 113 made of a metal such as Ni, a lower electrode 114, and a heater 115. The lower electrode 114 and a heater 115 are provided inside the main body 113. The lower electrode 114 is grounded. The heater 115 generates heat by power supply from a heater power supply (HPS) 116 to heat the substrate W to a desired temperature. The substrate support 112 is supported by a cylindrical support member 117 extending downward from a bottom center of the main body 113, and the support member 117 is installed on a bottom wall of the exhaust chamber 151 via an insulating member 118.

An opening is formed in an upper wall 111*a* of the processing chamber 111, and a shower head 120 is fitted in the opening so as to face the substrate support 112 via an insulating member 119. The shower head 120 is made of metal and has a cylindrical shape as a whole. Further, the shower head 120 includes an upper electrode. In the illustrated example, the shower head 120 itself functions as the upper electrode. However, a part of the shower head 120 may serve as the upper electrode. The shower head 120 has a base member 121 and a shower plate 122. The shower plate 122 has a disk shape, and a flange portion 122*a* is formed at an outer peripheral portion of the shower plate 122. The flange portion 122*a* is fixed to the base member 121 by screws through an intermediate member 123. A gas diffusion space 124 is formed between the base member 121 and the shower plate 122. A flange portion 121*a* is formed at an outer peripheral portion of the base member 121, and the flange portion 121*a* is supported by the insulating member 119. A plurality of gas injection holes 125 are formed in the shower plate 122. One gas inlet hole 126 is formed near an upper central part of the base member 121. A gas pipe 130a is connected to the gas inlet hole 126, and the gas pipe 130a is also connected to a gas supply unit 130 to be described later. A processing gas supplied from the gas supply unit 130 is injected into the processing chamber 111 in a shower-like manner through the shower head 120. That is, the processing gas is supplied to a space between the shower head 120 serving as the upper electrode and the substrate support 112 serving as the lower electrode 114.

Further, the base member 121 of the shower head 120 is provided with a heater 147 for heating the shower head 120. The heater 147 is powered by a heater power supply (not shown) to heat the shower head 120 to a desired temperature. A heat insulating member 149 is provided in a recess formed in the upper part of the base member 121.

The gas supply unit 130 includes a plurality of gas sources for individually supplying $TiCl_4$ gas, Ar gas, and $H_2$ gas, and a plurality of gas supply pipes for supplying individual gases from the gas sources. Each gas supply pipe is provided with an on/off valve (not shown) and a flow controller such as a mass flow controller (not shown) to start and stop the supply of each gas and control the flow rate of each gas. In addition to the above described gases, other gases such as $N_2$ gas and $NH_3$ gas may be contained.

Similar to the first embodiment, the RF power supply 30 is connected to the shower head 120 serving as the upper electrode through the power supply line 31. As an example of the RF power supply 30, one having a frequency of 10 kHz to 60 MHz may be used. By supplying RF power from the RF power supply 30 to the shower head 120 serving as the upper electrode, capacitively coupled plasma is generated between the shower head 120 serving as the upper electrode and the lower electrode 114 provided in the substrate support 112. The matcher 32 is connected downstream of the RF power supply 30 of the power supply line 31.

Similar to the first embodiment, the voltage waveform shaping unit 33 is provided downstream of the matcher 32 of the power supply line 31 to shape a voltage waveform of the RF power supply so as to suppress a positive voltage (plus side voltage) of the RF voltage applied to the upper electrode. The voltage waveform shaping unit 33 includes the capacitor 34 that is disposed downstream of the matcher 32 and a ground circuit 36 that is branched downstream of the capacitor 34 and grounded through the diode 35. As an example of the capacitor 34, one having a sufficient capacitance such that the impedance becomes low when viewed from the RF power supply 30 may be used. Instead of the capacitor 34, a blocking capacitor of the matcher 32 may be used.

Similar to the first embodiment, the voltage waveform shaping unit 33 has a charge storing function of the capacitor 34 and a rectifying function of the diode 35 of the ground circuit 36, so that the voltage waveform shaping unit 33 can be configured to allow the current to flow to the ground through the diode 35 when the RF power supply 30 outputs a positive voltage. As a result, the increase of the plasma potential is suppressed, so that the ion bombardment on the substrate W is suppressed.

Valves, flow controllers, RF power supplies and the like of the gas supply unit 130 that constitutes the plasma processing apparatus 105 are controlled by a controller (CNT) 160. The controller 160 is configured in the same manner as the controller 50 of the first embodiment.

Next, an operation of the plasma processing apparatus 105 configured as described above will be described.

First, the gate valve 158 is opened. Then, the substrate W is loaded into the processing chamber 111 through the loading/unloading port 157. Then, the substrate W is placed on the substrate support 112 that is maintained at a predetermined temperature. Next, the pressure in the processing chamber 111 is adjusted, and the preflow of Ar gas that is a plasma generating gas, $H_2$ gas that is a reducing gas, and $TiCl_4$ gas that is a Ti source gas is performed through preflow lines (not shown). Next, while maintaining the same gas flow and the same pressure, the lines are switched to film formation lines. Then, these gases are introduced into the processing chamber 111 through the shower head 120.

Then, in a state where Ar gas, H2 gas, and TiCl4 gas are introduced into the processing chamber 111, the RF power supply 30 is powered on to generate plasma and a Ti film is formed on a surface of the substrate W by plasma CVD.

The conditions at this time are as follows. The temperature of the substrate support 112 may be in a range of 300 to 700° C., and the pressure in the processing chamber 111 may be in a range of 13.3 to 1333 Pa (0.1 to 10 Torr).

The Ti film formation using the plasma CVD is achieved in such a manner that a surface of an underlying film is bombarded with the ions in the plasma to form a dangling bond, and TiCl3 or TiCl2, which is a dissociated species of TiCl4 that is a film forming source (precursor), is adsorbed on a portion where the dangling bond is formed.

When the Ti film is formed on the underlying film formed of, e.g., Si or SiGe having a small binding energy, low energy ion bombardment can be performed and it is desirable to reduce the ion energy of the plasma as much as possible.

Further, for a surface of a substrate having Si or SiGe and another material (for example, SiN or SiO2), there may be a demand for selectively forming a Ti film on Si or SiGe. Even in such a case, it is effective to reduce the ion energy.

Specifically, the binding energies of Si and SiGe are as small as 327 kJ/mol and 301 kJ/mol, respectively, while the binding energies of SiN and SiO2 are 798 kJ/mol and 439 kJ/mol, respectively, which are larger than those of Si and SiGe. Therefore, it is believed that the selective film formation on Si or SiGe can be realized by reducing the ion energy such that only Si or SiGe is dissociated.

The materials on which the selective film formation of the Ti film is performed is not limited to Si and SiGe, and if the surface has a first material portion having a relatively small binding energy and a second material portion having a relatively large binding energy, a Ti film may be selectively formed on the first material portion.

Generally, in order to reduce the ion energy, it is considered to increase the pressure in the processing chamber to a high pressure and/or lower the RF power. However, in the plasma processing using $TiCl_4$ gas, power is consumed for the decomposition. Therefore, it is difficult to maintain discharge at the high pressure and the low power.

In contrast, in the sixth embodiment, the voltage waveform shaping unit 33 is provided to shape a voltage waveform of the RF power supply 30 so as to suppress a positive voltage (plus side voltage) of the RF voltage applied to the upper electrode as in the first embodiment. Specifically, the capacitor 34 generates bias to maintain Vpp, and the rectifying function of the diode 35 in the ground circuit 36 eliminates large fluctuation of the voltage of the upper electrode in the positive direction to thereby suppress the increase of the plasma potential. As a result, the ion energy to the substrate W can be reduced without changing the plasma generation conditions, and a desired film forming process can be realized.

Further, when the frequency of the RF power supply 30 is high, the electron temperature is low and the discharge margin is lowered. Therefore, the frequency of the RF power supply 30 is preferably in a range of about 10 kHz to 60 MHz, for example, 450 kHz.

Next, experimental results of Ti film formation on Si and SiN of the substrate surface by using the apparatus with the voltage waveform shaping unit 33 and the apparatus without the voltage waveform shaping unit 33 will be described. Here, the Ti film was formed after the natural oxide film on the Si and SiN surfaces was removed by a dry treatment.

The conditions are as follows:
Frequency of RF power: 450 kHz
RF power: 40 W
Pressure: 2.0 Torr
Gap between electrodes: 13.5 mm
Temperature of substrate support: 450° C.
Gas: $TiCl_4/Ar/H_2$=25/2400/1000 sccm.

Figure 24:
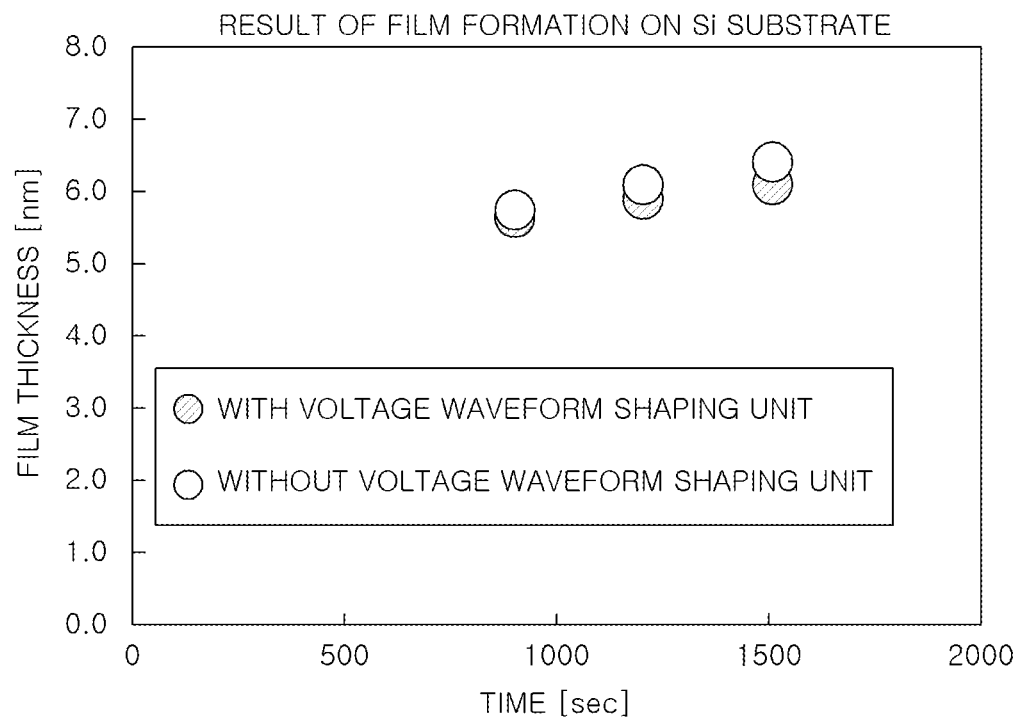
FIG. 24 shows a relationship between a film forming time and a film thickness when a Ti film is formed on Si in each of the plasma processing apparatus of FIG. 23 provided with the voltage waveform shaping unit and a plasma processing apparatus provided without the voltage waveform shaping unit.

FIG. 24 shows a relationship between a film forming time and a film thickness when a Ti film is formed on Si in each of the plasma processing apparatus of FIG. 23 provided with the voltage waveform shaping unit 33 and the plasma processing apparatus provided without the voltage waveform shaping unit 33. As shown in FIG. 24, it was found that the film thickness was almost the same on Si regardless of using the voltage waveform shaping unit 33.

Figure 25:
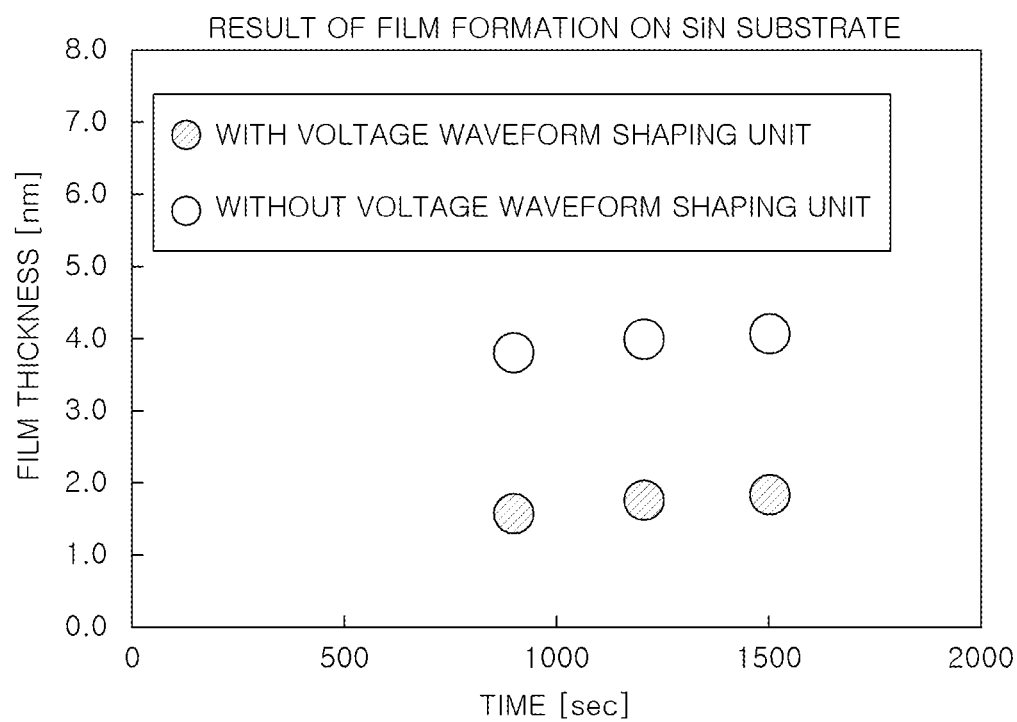
FIG. 25 shows a relationship between a film forming time and a film thickness when a Ti film is formed on SiN in each of the plasma processing apparatus of FIG. 23 provided with the voltage waveform shaping unit and the plasma processing apparatus provided without the voltage waveform shaping unit.

Further, FIG. 25 shows a relationship between the film forming time and the film thickness when a Ti film is formed on SiN in each of the plasma processing apparatus of FIG. 23 provided with the voltage waveform shaping unit 33 and the plasma processing apparatus provided without the voltage waveform shaping unit 33. As shown in FIG. 25, it was found that the film thickness was reduced by about 60% on SiN by using the voltage waveform shaping unit 33.

Figure 26:
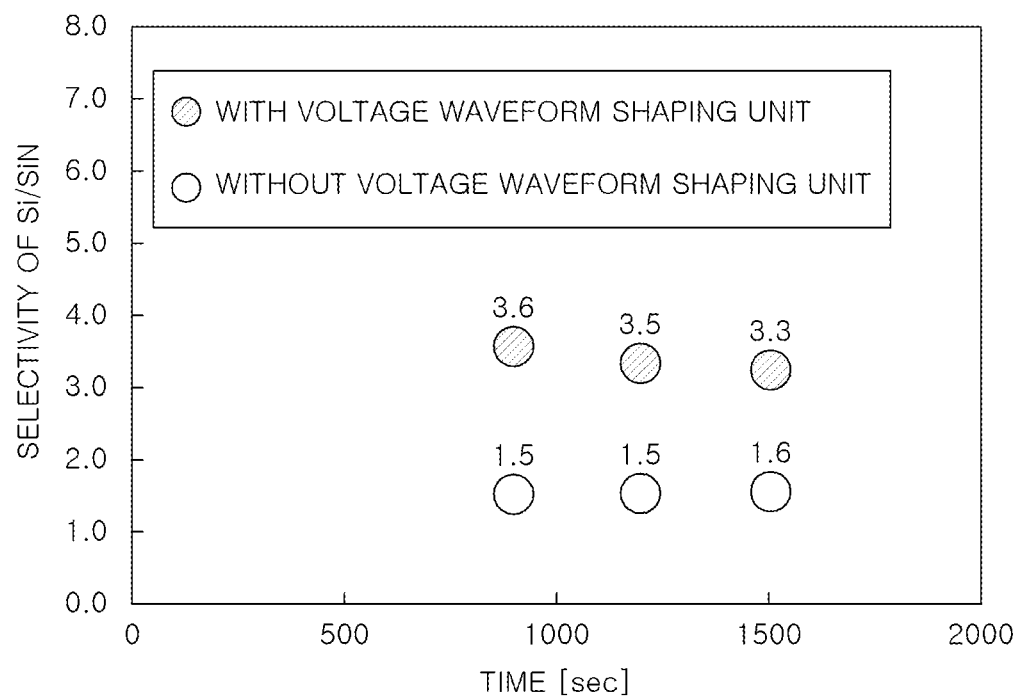
FIG. 26 shows an average value of the selectivity (the selectivity of Si/SiN) of the film thickness of the Ti film on Si and the film thickness of the Ti film on SiN in each of the plasma processing apparatus of FIG. 23 provided with the voltage waveform shaping unit and the plasma processing apparatus provided without the voltage waveform shaping unit.

FIG. 26 shows an average value of the selectivity (the selectivity of Si/SiN) of the film thickness of the Ti film on Si and the film thickness of the Ti film on SiN that is obtained from the above results. As shown in FIG. 26, the selectivity of Si/SiN without the voltage waveform shaping unit 33 was in a range of about 1.5 to 1.6 and the selectivity of Si/SiN with the voltage waveform shaping unit 33 was in a range of about 3.3 to 3.6. This indicates that the selectivity is significantly improved with the voltage waveform shaping unit 33. Further, although it is not illustrated in FIG. 26, it was also found that the selectivity of Si/SiN was improved from 1.6 to 4.9 at the center of the substrate. Thus, it was found that the selectivity was further improved at the center of the substrate.

Further, in the sixth embodiment as well, by exciting the plasma with the voltage waveform shaping unit 33 provided, the plasma is generated and concentrated in the vicinity of the shower head 120 serving as the upper electrode. Therefore, the injected gas inevitably passes through the high-density plasma region, so that the gas can be efficiently turned into the plasma or radicalized.

Further, in the sixth embodiment as well, instead of the diode, the switching element described in the second embodiment may be used as an element for selectively flowing the current to the ground when a positive voltage is applied. Further, in addition to the element such as the diode or the switching element for selectively flowing a current to the ground when the positive voltage is applied, the voltage adjuster such as the Zener diode, the resistor or the power supply described in the third to fifth embodiments may be provided as a ground circuit. As a result, the ion energy can be appropriately controlled according to the underlying film, and the film forming property, particularly the selective film forming property can be controlled.

Seventh Embodiment

Next, a seventh embodiment which is another specific embodiment will be described.

Figure 27:
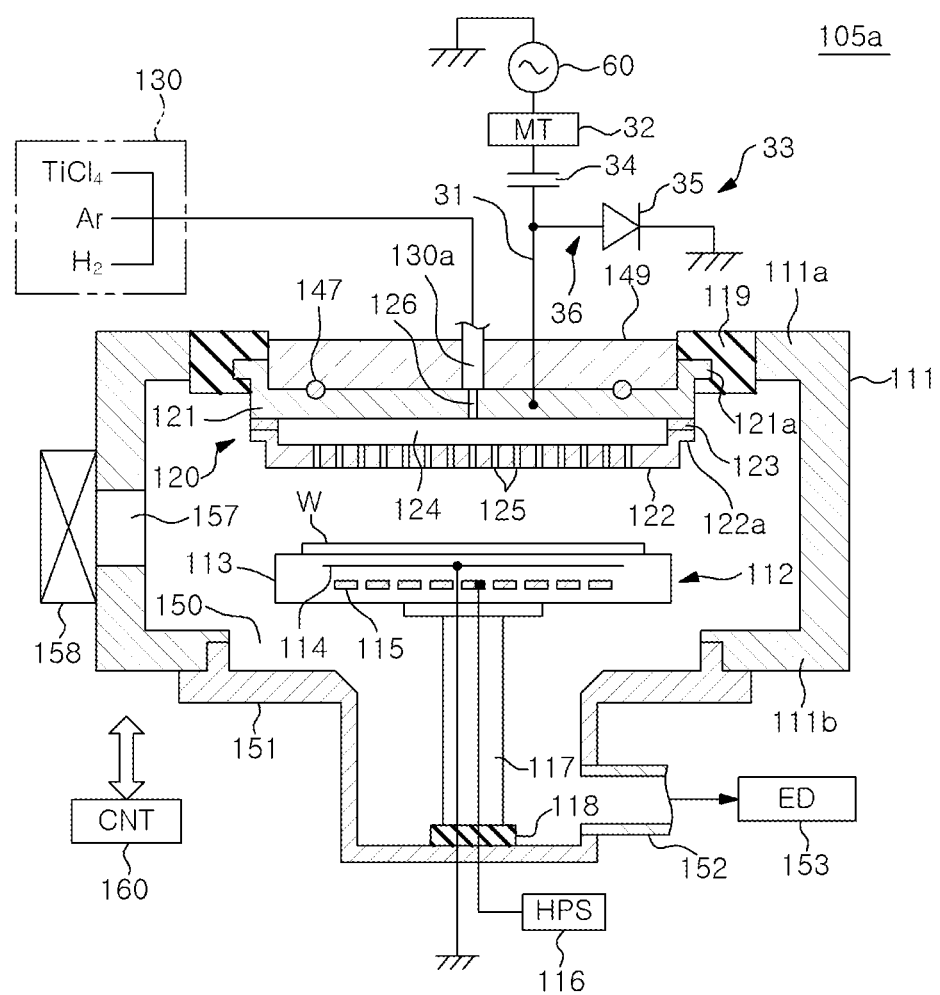
FIG. 27 is a cross-sectional view showing a plasma processing apparatus according to a seventh embodiment.

FIG. 27 is a cross-sectional view showing a plasma processing apparatus according to the seventh embodiment.

The plasma processing apparatus 105*a* of the seventh embodiment is different from the plasma processing apparatus 105 according to the sixth embodiment of FIG. 23 only in that a RF pulse power supply 60 is used instead of the RF power supply 30. Other configurations are the same as those of the plasma processing apparatus of FIG. 23, and thus the same reference numeral will be given to the same parts and the description thereof will be omitted.

In the seventh embodiment, the plasma processing apparatus 105*a* of FIG. 27 realizes the selective film formation of the Ti film as described in the sixth embodiment and also suppresses corrosion of the Ti film by using pulsed RF power.

In the sixth embodiment, the increase of the plasma potential is suppressed by using the voltage waveform shaping unit 33, so that the ion energy to the substrate W is reduced without changing the plasma generation conditions such that only the first material portion having a small binding energy is dissociated. In such a manner, the selective film formation is realized. For example, the ion energy is reduced to dissociate only Si or SiGe having a relatively small binding energy while SiN or SiO2 having a relatively large binding energy is not dissociated, so that the selective film formation can be realized.

When the Ti film is to be thickened by the selective film formation of the Ti film using the voltage waveform shaping unit 33 in the above manner, it is considered to increase the RF power or lengthen the film forming time. However, in either case, it was found that Cl residual concentration in the film became high and the corrosion of the film proceeded. In the case where the Ti film is not corroded, O, N, and Cl are observed on the surface side of the Ti film, and an oxide layer is formed on the surface of the Ti film. However, in the case where the Ti film is corroded, O, N, and Cl are observed in the film, and an oxide layer is formed between the Ti film and an underlying Si film.

Therefore, in the seventh embodiment, the RF pulse power supply 60 is used to apply pulsed RF power to the shower head 120 serving as the upper electrode to thereby generate plasma. The pulsed RF power is typically applied periodically, causing ON and OFF of the RF power to be repeated.

As such, the Ti film is thickened in the selective film formation of the Ti film by supplying the pulsed RF power. Therefore, even when the power is increased or the film forming time is lengthened, the corrosion of the film can be suppressed.

The mechanism in which the corrosion of the Ti film is suppressed by supplying the pulsed RF power is conceived as follows.

When the pulse is OFF, TiCl4 contributes not to film formation but to etching of weak Cl bonds on the film surface. In addition, since the film forming rate is slow, the time for the decoupling of Cl can be secured.

Further, in an afterglow region after the pulse is OFF, the sheath disappears and ion-ion plasma is generated by replacing electrons with ions. Further, since the substrate is negatively charged at the moment when the pulse is OFF, H3+ ions, which are positive ions in the plasma, are directed toward the substrate. As a result, it is believed that H3+ reduces Cl in the Ti film and the effect of suppressing corrosion is enhanced.

The frequency of the RF pulse power supply 60 is preferably in a range of about 10 kHz to 60 MHz, for example 450 kHz, similar to the frequency of the RF power supply 30 in the sixth embodiment. The frequency of the pulse is preferably in a range of about 0.1 to 500 kHz, for example, 10 kHz. Further, the duty ratio of the pulse may be in a range of 1 to 99%, preferably 10 to 90%.

Figure 28:
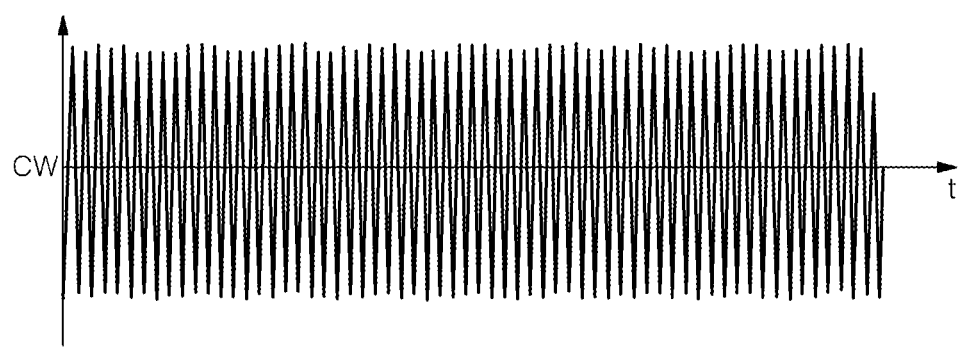
FIG. 28 shows a voltage waveform of the upper electrode when RF power of continuous wave is applied.
Figure 29A:
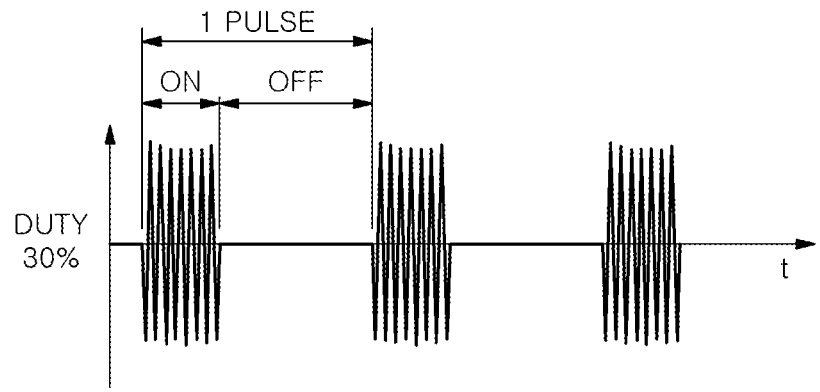
FIGS. 29A to 29C show voltage waveforms of the upper electrode when pulsed RF power is applied, FIG. 29A showing a case where a duty ratio is 30%, FIG. 29B showing a case where the duty ratio is 50%, and FIG. 29C showing a case where the duty ratio is 80%.
Figure 29B:
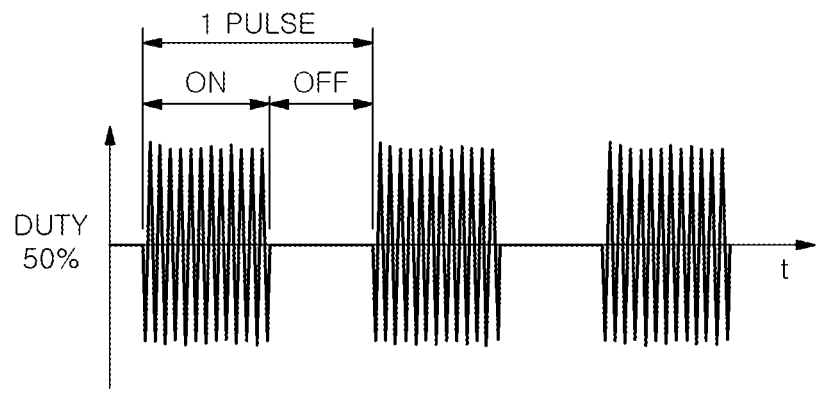
Figure 29C:
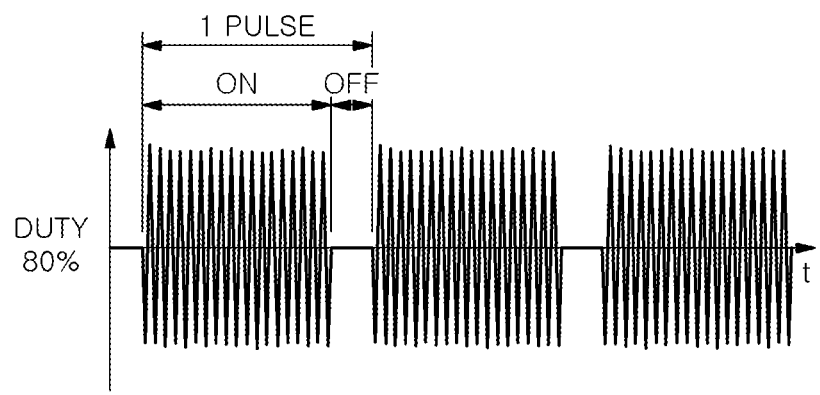

The voltage waveform of the upper electrode when the RF power of continuous wave (CW) is applied is shown in FIG. 28, and the voltage waveform of the upper electrode when the pulsed RF power is applied is shown in FIGS. 29A to 29C. FIG. 29A shows a case where the duty ratio is 30%, FIG. 29B shows a case where the duty ratio is 50%, and FIG. 29C shows a case where the duty ratio is 80%. The frequency of the RF power is 450 kHz and the pulse frequency is 10 kHz.

It is not necessary for the pulsed RF power to be completely ON and OFF as described above, and the repetition of a large power and a small power may be accepted.

Next, experimental results of Ti film formation on Si and SiN of the substrate surface will be described in the case of using the apparatus of FIG. 23 for applying the RF power of the continuous wave and the apparatus of FIG. 27 for applying the pulsed RF power in both of which the voltage waveform shaping unit 33 is removed. Here, the Ti film was formed after the natural oxide film on the Si and SiN surfaces was removed by a dry treatment.

Here, in the case of applying the pulsed RF power, the duty ratio was set to 80% and 50%. The film forming time was set to 360 seconds for the continuous wave. Further, the film forming time for the pulsed RF power was set to 450 seconds for the duty ratio of 80% and 720 seconds for the duty ratio of 50% so that the RF power applying time was identical to each other.

Other conditions are as follows:
Frequency of RF power: 450 kHz
RF power: 100 W
Pressure: 4.0 Torr
Gap between electrodes: 13.5 mm
Temperature of substrate support: 450° C.
Gas: $TiCl_4/Ar/H_2$=25/2400/1000 sccm
Pulse frequency: 10 kHz.

After the film formation was completed, the substrate was extracted from the processing chamber. Then, the presence of corrosion of the Ti film was confirmed, and the sheet resistance was measured. As a result, in the case of the continuous wave, the corrosion of the Ti film was in progress and the sheet resistance of the film was 510.1 Ω/sq. In contrast, in the case of the pulse with the duty ratio of 80%, the corrosion of the Ti film was observed, but the corrosion was suppressed as compared with the case of the continuous wave, and the sheet resistance was 276.4 Ω/sq. In the case of the pulse with the duty ratio of 50%, no corrosion of the Ti film was observed.

That is, while the RF power of the continuous wave causes the corrosion to proceed, the pulsed RF power suppresses the corrosion of the Ti film. Further, by reducing the duty ratio of the pulse, the corrosion of the Ti film is further suppressed.

In the above-described experiment, the apparatus provided without the voltage waveform shaping unit was used. Therefore, the Ti film having substantially the same film thickness was formed on the Si film and the SiN film, and no selectivity was observed.

Next, experimental results of Ti film formation on Si and SiN of the substrate surface will be described in the case of using the apparatus of FIG. 23 for applying the RF power of the continuous wave and the apparatus of FIG. 27 for applying the pulsed RF power, both of which having the voltage waveform shaping unit 33. Here, the Ti film was formed after the natural oxide film on the Si and SiN surfaces was removed by a dry treatment.

Here, for conditions A and B, RF power of a continuous wave having power of 40 W was applied and the processing times were set to 900 seconds and 1200 seconds, respectively. Further, for condition C, pulsed RF power having a duty ratio of 20% was applied, the RF power was set to 60 W, and the processing time was set to 1500 seconds.

Other conditions are as follows:
Frequency of RF power: 450 kHz
Pressure: 6.0 Torr
Gap between electrodes: 13.5 mm
Temperature of substrate support: 450° C.
Gas: $TiCl_4/Ar/H_2$=25/2400/1000 sccm
Pulse frequency: 10 kHz After the film formation was completed, the substrate was extracted from the processing chamber. Then, the film thickness of the Ti film on the Si film and the film thickness of the Ti film on the SiN film were measured for each of the conditions A, B, and C.

As a result, under the condition A, the average thickness of the Ti film on the Si film and the average thickness of the Ti film on the SiN film was 5.7 nm and 0.8 nm, respectively, and the average value of the selectivity of Si/SiN was 7.2. Under the condition B, the average thickness of the Ti film on the Si film and the average thickness of the Ti film on the SiN film was 6.2 nm and 0.8 nm, respectively, and the average value of the selectivity of Si/SiN was 7.8. Under the condition C, the average thickness of the Ti film on the Si film and the average thickness of the Ti film on the SiN film was 8.15 nm and 1.07 nm, respectively, and the average value of the selectivity of Si/SiN was 7.63. In each case, the selectivity of Si/SiN was high since the voltage waveform shaping unit 33 is used.

Next, the corrosion of the Ti film was confirmed for each of the conditions A, B, and C. No corrosion was observed under the condition A, but the corrosion was observed under the condition B in which the processing time was lengthened. Under the condition C in which the pulsed RF power was applied, the corrosion of the Ti film was not observed even though the film thickness was greater than the film thickness under the condition B. Further, the sheet resistance was confirmed for each of the conditions A, B, and C. The sheet resistance under the condition A was 336.2 Ω/sq whereas the sheet resistance under the condition C was 259.1 Ω/sq. Thus, it was found that the sheet resistance was reduced as a result of suppressing the corrosion of the film by applying a pulsed RF power.

From the above results, by using the voltage waveform shaping unit 33 and the pulsed RF power together, it was found that the film thickness of the Ti film on the Si film can be increased while maintaining the effect of forming the Ti film on the Si film with a high selectivity and suppressing the corrosion.

Eighth Embodiment

Next, an eighth embodiment that is another specific embodiment will be described.

In the eighth embodiment, a case where a plasma processing apparatus having the structure shown in the first embodiment is applied to an etching apparatus is illustrated.

Figure 30:
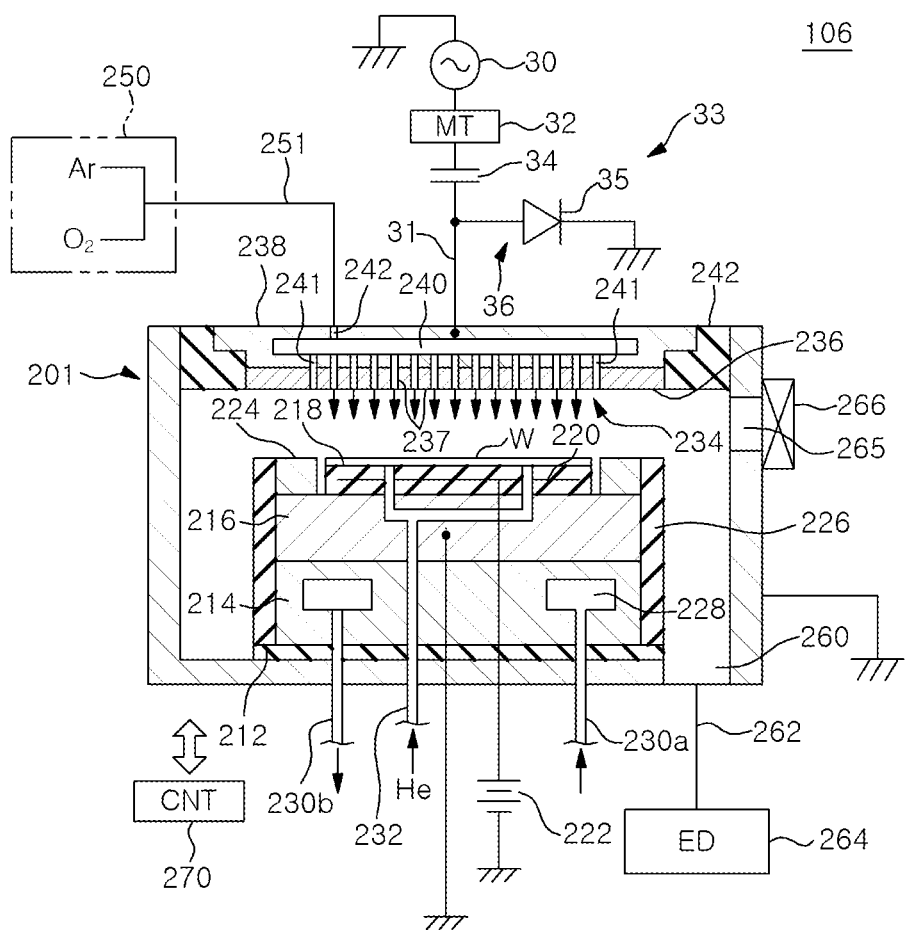
FIG. 30 is a cross-sectional view showing a plasma processing apparatus according to an eighth embodiment.

FIG. 30 is a cross-sectional view showing the plasma processing apparatus according to the eighth embodiment.

The plasma processing apparatus 106 according to the present embodiment is an etching apparatus for etching a film on the substrate W. Further, the plasma processing apparatus 106 is configured as a capacitively coupled plasma processing apparatus. Examples of the substrate W include, but are not limited to, a semiconductor wafer.

The plasma processing apparatus 106 has a metal processing chamber 201 having a substantially cylindrical shape. The processing chamber 201 is frame-grounded.

At the bottom of the processing chamber 201, a columnar metal support base 214 is arranged via an insulating plate 212 made of ceramics, and a columnar substrate support 216 made of, for example, aluminum is placed on the support base 214. The substrate support 216 constitutes the lower electrode and is grounded. The substrate support 216 has an electrostatic chuck 218 on an upper surface thereof to attract and hold the substrate W by an electrostatic force. The electrostatic chuck 218 has a structure in which an electrode 220 is provided inside an insulator. A DC voltage is applied to the electrode 220 from a DC power supply 222, so that the substrate W is attracted and held by an electrostatic force such as a Coulomb force.

A conductive focus ring 224 made of, for example, silicon is disposed around the electrostatic chuck 218 on an upper surface of the substrate support 216 to improve the etching uniformity. A cylindrical inner wall member 226 made of, for example, quartz is disposed on the side surfaces of the substrate support 216 and the support base 214.

A coolant chamber 228 is disposed in the support base 214. A coolant, for example, cooling water, is supplied from an external chiller unit (not shown) through pipes 230a and 230b and circulated in the coolant chamber. The processing temperature of the substrate W on the substrate support 216 is controlled by the temperature of the coolant.

Further, a heat transfer gas, for example, He gas, from a heat transfer gas supply mechanism (not shown) is supplied between an upper surface of the electrostatic chuck 218 and a rear surface of the substrate W through a gas supply line 232.

A shower head 234 serving as the upper electrode is disposed above the substrate support 216 serving as the lower electrode to face the substrate support 216. A space between the shower head 234 serving as the upper electrode and the substrate support 216 serving as the lower electrode is the plasma generation space.

The shower head 234 serving as the upper electrode is supported at an upper portion of the processing chamber 201 via an insulating shielding member 243. The shower head 234 includes an electrode plate 236 and an electrode holder 238. The electrode plate 236 constitutes a surface facing the substrate support 216 and has a plurality of gas injection holes 237. The electrode holder 238 has a water-cooling structure and detachably holds the electrode plate 236. A gas diffusion space 240 is formed in the electrode holder 238. A plurality of gas holes 241 respectively communicating with the gas injection holes 237 extend downward from the gas diffusion space 240. A gas inlet hole 242 for introducing the processing gas to the gas diffusion space 240 is formed at the electrode holder 238. A gas pipe 251 connected to a gas supply unit 250 to be described later is connected to the gas inlet hole 242. The processing gas supplied from the gas supply unit 250 is injected into the processing chamber 201 in a shower-like manner through the shower head 234. That is, the processing gas is supplied to the space between the shower head 234 serving as the upper electrode and the substrate support 216 serving as the lower electrode.

The gas supply unit 250 includes gas sources for individually supplying a plurality of gases including Ar gas and $O_2$ gas, and a plurality of gas supply pipes for supplying individual gases from the gas sources. Although the gas supply unit 250 including only Ar and $O_2$ is illustrated in FIG. 30, other gases necessary for etching may be contained in addition to Ar gas and $O_2$ gas. Examples of other gases include halogen-containing gases such as $CF_4$, $C_4F_8$, $CHF_3$, HBr, and $Cl_2$. Each gas supply pipe is provided with an on/off valve (not shown) and a flow controller such as a mass flow controller (not shown) to start and stop the supply of each gas and control the flow rate of each gas.

An exhaust port 260 is formed at the bottom of the processing chamber 201, and an exhaust device (ED) 264 is connected to the exhaust port 260 through an exhaust pipe 262. The exhaust device 264 includes an automatic pressure control valve and a vacuum pump. The exhaust device 264 is configured to exhaust an inner space of the processing chamber 201 and maintain the pressure in the inner space of the processing chamber 201 at a desired vacuum level.

Further, a loading/unloading port 265 for loading and unloading the substrate W into and from the processing chamber 201 is formed at a sidewall of the processing chamber 201. The loading/unloading port 265 is opened and closed by a gate valve 266.

Similar to the first embodiment, the RF power supply 30 is connected to the shower head 234 serving as the upper electrode through the power supply line 31. As an example of the RF power supply 30, one having a frequency of 10 kHz to 60 MHz may be used. By supplying RF power from the RF power supply 30 to the shower head 234 serving as the upper electrode, capacitively coupled plasma is generated between the shower head 234 serving as the upper electrode and the substrate support 216 serving as the lower electrode. The matcher 32 is connected downstream of the RF power supply 30 of the power supply line 31.

Similar to the first embodiment, the voltage waveform shaping unit 33 is provided downstream of the matcher 32 of the power supply line 31 to shape a voltage waveform of the RF power supply so as to suppress a positive voltage (plus side voltage) of the RF voltage applied to the upper electrode. The voltage waveform shaping unit 33 includes the capacitor 34 that is disposed downstream of the matcher 32 and a ground circuit 36 that is branched downstream of the capacitor 34 and grounded through the diode 35. As an example of the capacitor 34, one having a sufficient capacitance such that the impedance becomes low when viewed from the RF power supply 30 may be used. Instead of the capacitor 34, a blocking capacitor of the matcher 32 may be used.

Similar to the first embodiment, the voltage waveform shaping unit 33 has a charge storing function of the capacitor 34 and a rectifying function of the diode 35 of the ground circuit 36, so that the voltage waveform shaping unit 33 can be configured to allow the current to flow to the ground through the diode 35 when the RF power supply 30 outputs a positive voltage. As a result, the increase of the plasma potential is suppressed, so that the ion energy to the substrate W is reduced.

Valves, flow controllers, RF power supplies and the like of the gas supply unit 250 that constitutes the plasma processing apparatus 106 are controlled by a controller (CNT) 270. The controller 270 is configured in the same manner as the controller 50 of the first embodiment.

Next, an operation of the plasma processing apparatus 106 configured as described above will be described.

First, the gate valve 266 is opened. Then, the substrate W having an etching target film is loaded into the processing chamber 201 through the loading/unloading port 265. Then, the substrate W is placed on the substrate support 216. Next, the inner space of the processing chamber 201 is exhausted by the exhaust device (ED) 264 and the pressure is adjusted. Then, a gas containing Ar gas and $O_2$ gas is supplied as the processing gas for etching from the gas supply unit 250 to the shower head 234, and the gas is injected into the processing chamber 201 through the gas injection holes 237. At the same time, the RF power supply 30 is powered on to generate plasma, and the plasma etching is performed on the etching target film of the substrate W.

The conditions at this time are as follows. The temperature of the substrate support 216 (electrostatic chuck 218) is 30° C. or less. The pressure in the processing chamber 201 is in a range of 0.133 to 133 Pa (1 to 1000 mTorr), for example, 67 Pa (500 mTorr).

$Ar/O_2$ mixed plasma is often used for the plasma etching or the plasma ashing, and it is technically important to improve its controllability. In particular, the reaction at the interface between the plasma and the substrate is important, and the difference in ion energy at the interface significantly affects the surface reaction and the process result.

In the eighth embodiment, as in the first embodiment, the voltage waveform shaping unit 33 is provided to shape the voltage waveform of the RF power supply 30 so as to suppress the positive voltage (plus side voltage) of the RF voltage applied to the upper electrode. Specifically, a bias is generated by the charge storing function of the capacitor 34, and the rectifying function of the diode 35 in the grounded circuit 36 eliminates the large fluctuation of the voltage of the upper electrode in the positive direction to thereby suppress the increase of the plasma potential. As a result, the etching property can be controlled by reducing the ion energy to the substrate W without changing the plasma state. When the temperature of the substrate support 216 (electrostatic chuck 218) is 30° C. or less, the etching by ion energy is dominant, so that the etching controllability due to a decrease in ion energy can be particularly improved.

Next, experimental results of plasma etching of a photoresist using $Ar/O_2$ plasma by an apparatus with the voltage waveform shaping unit 33 and an apparatus without the voltage waveform shaping unit 33 will be described.

The conditions at this time are as follows:
Substrate: 300 mm Si wafer
Frequency of RF power: 450 kHz
RF power: 300 W
Pressure: 800 mTorr
Gas: $Ar/O_2$=1000/500 sccm
Gap between electrodes: 15 mm
Temperature of electrostatic chuck: 23° C. or more
Focus ring: Si (floating)

Figure 31:
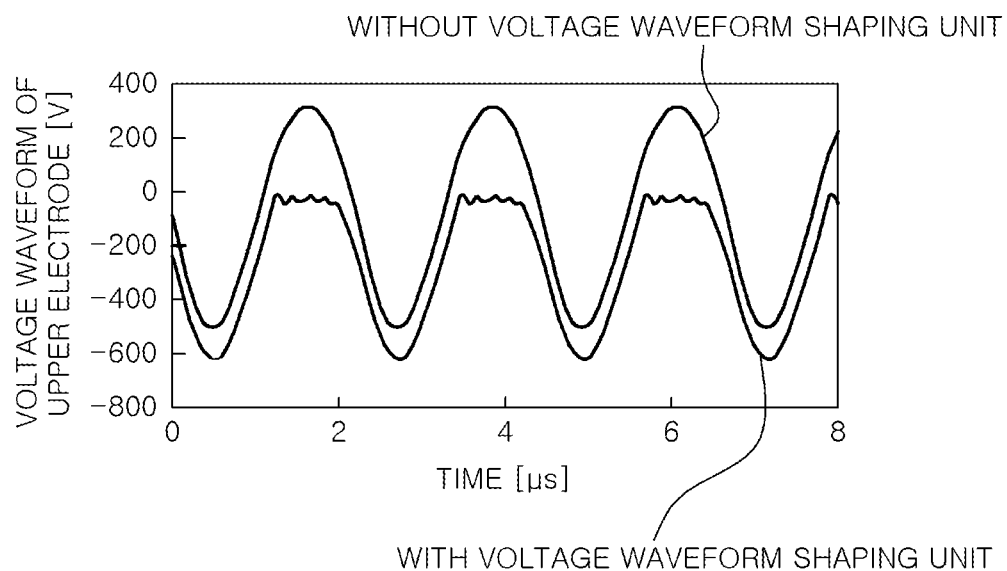
FIG. 31 shows a voltage waveform of the upper electrode in each of the plasma processing apparatus of FIG. 30 provided with the voltage waveform shaping unit and the plasma processing apparatus provided without the voltage waveform shaping unit.

FIG. 31 shows a voltage waveform of the upper electrode in each of the plasma processing apparatus of FIG. 30 provided with the voltage waveform shaping unit 33 and the plasma processing apparatus provided without the voltage waveform shaping unit 33. As shown in FIG. 31, it was found that the voltage of the upper electrode in the positive direction is reduced by using the voltage waveform shaping unit 33.

Figure 32:
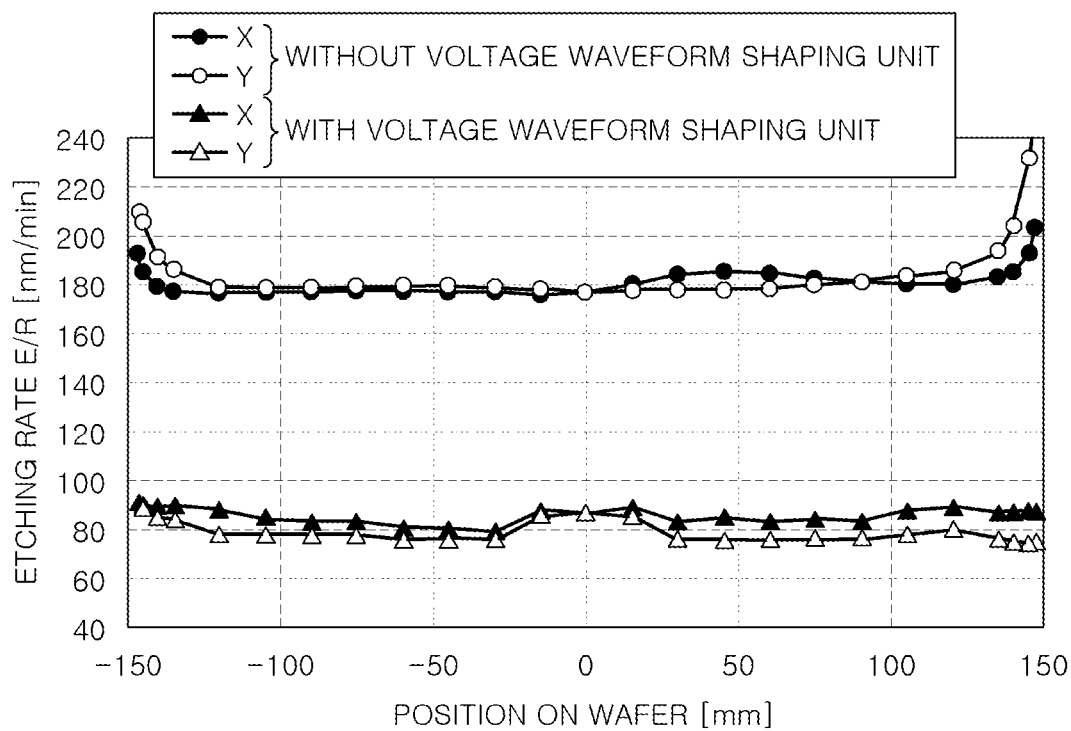
FIG. 32 shows an etching rate at each position (X direction and Y direction) on the wafer in each of the plasma processing apparatus of FIG. 30 provided with the voltage waveform shaping unit and the plasma processing apparatus provided without the voltage waveform shaping unit.

FIG. 32 shows an etching rate at each position on the wafer (X direction and Y direction) in each of the plasma processing apparatus of FIG. 30 provided with the voltage waveform shaping unit 33 and the plasma processing apparatus provided without the voltage waveform shaping unit 33. As shown in FIG. 32, it was found that the etching rate with the voltage waveform shaping unit 33 was 0.44 times the etching rate without the voltage waveform shaping unit 33. Since the temperature of the electrostatic chuck in this experiment is 30° C. or less that is a sufficiently low temperature, etching by ion energy is dominant over etching by O radicals. Thus, a decrease in etching rate due to the use of the voltage waveform shaping unit 33 is the effect caused by a decrease in ion energy.

Figure 33:
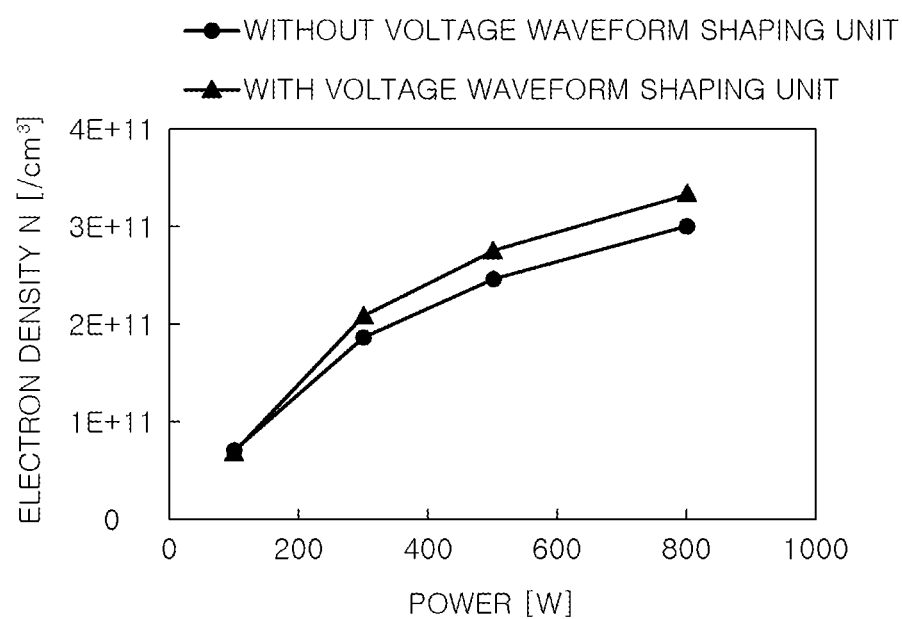
FIG. 33 shows a relationship between RF power and electron density (average value) in each of the plasma processing apparatus of FIG. 30 provided with the voltage waveform shaping unit and the plasma processing apparatus provided without the voltage waveform shaping unit.

Next, in each of the plasma processing apparatus of FIG. 30 provided with the voltage waveform shaping unit 33 and the plasma processing apparatus provided without the voltage waveform shaping unit 33, the RF power is changed to 100 W, 300 W, 500 W, and 800 W to obtain the electron densities in the X and Y directions at the intermediate height position between the shower head 234 serving as the upper electrode and the substrate support 216 serving as the lower electrode. The result is shown in FIG. 33. FIG. 33 shows a relationship between the RF power and the average value of the electron densities at respective positions in the X direction and the Y direction. As shown in FIG. 33, it was found that there was no significant change in the electron density (plasma density) with or without the voltage waveform shaping unit 33.

From the above results, by using the voltage waveform shaping unit 33, it is possible to reduce only the ion energy without significantly changing the electron density by the $Ar/O_2$ mixed plasma, and the plasma etching with good controllability can be performed.

Further, in the eighth embodiment as well, when the plasma is excited with the voltage waveform shaping unit 33 provided, the plasma is generated and concentrated in the vicinity of the shower head 234 serving as the upper electrode. Therefore, the injected gas inevitably passes through the high-density plasma region, so that the gas can be efficiently turned into the plasma or radicalized.

Further, in the eighth embodiment as well, instead of the diode, the switching element described in the second embodiment may be used as an element for selectively flowing the current to the ground when a positive voltage is applied. Further, in addition to the element such as the diode or the switching element for selectively flowing a current to the ground when the positive voltage is applied, the voltage adjuster such as the Zener diode, the resistor or the power supply described in the third to fifth embodiments may be provided as a ground circuit. As a result, the ion energy can be controlled, and the controllability of the plasma etching can be further improved.

<Other Applications>

Although the embodiments have been described above, the presently disclosed embodiments are considered in all respects to be illustrative and are not restrictive. The above-described embodiments can be embodied in various forms. Further, the above-described embodiments may be omitted, replaced, or changed in various forms without departing from the scope of the appended claims and the gist thereof.

For example, in the above-described embodiments, the shower head that introduces a gas to the space between the upper electrode and the lower electrode is used as the upper electrode. However, such a gas introduction portion may be provided separately from the upper electrode. Further, the apparatuses of the above-described embodiments are merely examples, and any apparatus may be employed as long as it is a capacitively coupled type plasma processing apparatus in which the RF power is applied to the upper electrode and the lower electrode is grounded. Moreover, although the semiconductor wafer is illustrated as the substrate, the substrate is not limited to the semiconductor wafer. Other substrates such as a flat panel display (FPD) substrate represented by a liquid crystal display (LCD) substrate, a ceramic substrate, or the like may be used.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:

1. A plasma processing apparatus for performing plasma processing on a substrate, comprising:
    a processing chamber;
    a substrate support on which the substrate is placed, the substrate support being disposed in the processing chamber;
    a lower electrode provided in the substrate support, the lower electrode being grounded;
    an upper electrode disposed to face the lower electrode;
    a gas supply source to supply a processing gas to a space between the upper electrode and the substrate support;
    a radio frequency power supply to apply RF power to the upper electrode to generate plasma of the processing gas;
    a matcher matching a load impedance with an internal impedance of the RF power supply, the matcher connected downstream of the RF power supply; and
    a voltage waveform shaping processor provided between the matcher and the upper electrode to shape a voltage waveform of the RF power supply to suppress a positive voltage of an RF voltage applied to the upper electrode,
    wherein the voltage waveform shaping processor includes:
        a capacitor that is disposed, downstream of the matcher, in a power supply line of the RF power supply, and
        a ground circuit that includes a first diode, the ground circuit being branched downstream of the capacitor in the power supply line and grounded through the first diode.

2. The plasma processing apparatus of claim 1, wherein the ground circuit further includes a voltage adjuster to adjust a voltage applied to the upper electrode.

3. The plasma processing apparatus of claim 2, wherein the voltage adjuster includes a Zener diode disposed downstream of the first diode.

4. The plasma processing apparatus of claim 2, wherein the voltage adjuster includes a resistor.

5. The plasma processing apparatus of claim 4, wherein the resistor is a variable resistor.

6. The plasma processing apparatus of claim 2, wherein the voltage adjuster includes a power supply.

7. The plasma processing apparatus of claim 6, wherein the power supply is a variable power supply.

8. The plasma processing apparatus of claim 1, wherein the gas supply source includes a shower head to inject the processing gas toward the substrate, and the shower head includes the upper electrode.

9. The plasma processing apparatus of claim 1, wherein the processing gas contains $TiCl_4$, $H_2$ and Ar, and the plasma processing is a processing for forming a Ti film on a surface of the substrate.

10. The plasma processing apparatus of claim 9, wherein the substrate has a first material portion having a relatively small binding energy and a second material portion having a relatively large binding energy on the surface thereof, and the Ti film is selectively formed on the first material portion.

11. The plasma processing apparatus of claim 10, wherein the first material portion is Si or SiGe.

12. The plasma processing apparatus of claim 10, wherein the second material portion is SiN or $SiO_2$.

13. The plasma processing apparatus of claim 9, wherein the RF power supply is a RF pulse power supply to supply pulsed RF power.

14. The plasma processing apparatus of claim 1, wherein the processing gas contains Ar and $O_2$, and the plasma processing is an etching process of performing plasma etching on a surface portion of the substrate.

15. A plasma processing apparatus for performing plasma processing on a substrate, comprising:
    a processing chamber;
    a substrate support on which the substrate is placed, the substrate support being disposed in the processing chamber;
    a lower electrode provided in the substrate support, the lower electrode being grounded;
    an upper electrode disposed to face the lower electrode;
    a gas supply source to supply a processing gas to a space between the upper electrode and the substrate support;
    a radio frequency power supply to apply RF power to the upper electrode to generate plasma of the processing gas;
    a matcher matching a load impedance with an internal impedance of the RF power supply, the matcher connected downstream of the RF power supply; and
    a voltage waveform shaping processor provided between the RF power supply and the upper electrode to shape a voltage waveform of the RF power supply to suppress a positive voltage of an RF voltage applied to the upper electrode,
    wherein the voltage waveform shaping processor includes:
    a capacitor that is disposed, downstream of the matcher, in a power supply line of the RF power supply, and
    a ground circuit including a switching element and being branched downstream of the capacitor in the power supply line and grounded through the switching element, wherein the switching element is opened and closed to selectively flow a current to a ground when a positive voltage is applied to the upper electrode.

16. A plasma processing apparatus for performing plasma processing on a substrate, comprising:
    a processing chamber;
    a substrate support on which the substrate is placed, the substrate support being disposed in the processing chamber;
    a lower electrode provided in the substrate support, the lower electrode being grounded;
    an upper electrode disposed to face the lower electrode;
    a gas supply source to supply a processing gas to a space between the upper electrode and the substrate support;
    a radio frequency power supply to apply RF power to the upper electrode to generate plasma of the processing gas; and a matcher matching a load impedance with an internal impedance of the RF power supply, the matcher connected downstream of the RF power supply;

a voltage waveform shaping processor provided between the matcher and the upper electrode to shape a voltage waveform of the RF power supply to suppress a positive voltage of an RF voltage applied to the upper electrode, wherein the voltage waveform shaping processor includes:

a capacitor that is disposed, downstream of the matcher, in a power supply line of the RF power supply, and a ground circuit that includes a first diode, the ground circuit being branched downstream of the capacitor in the power supply line and grounded through the first diode, wherein the ground circuit further includes a voltage adjuster to adjust a voltage applied to the upper electrode, wherein the voltage adjuster includes a plurality of Zener diodes each having different Zener voltages, and the ground circuit includes a switch to switch to any one of the plurality of Zener diodes, the switch disposed between the first diode and the plurality of Zener diodes.

* * * * *